(12) United States Patent
Fukuma et al.

(10) Patent No.: US 7,242,585 B2
(45) Date of Patent: Jul. 10, 2007

(54) ELECTRONIC DEVICE

(75) Inventors: Yohei Fukuma, Tokyo (JP); Ryo Yamamoto, Saitama (JP); Toru Karashima, Kanagawa (JP)

(73) Assignee: Sony Corporation, Tokyo (JP)

( * ) Notice: Subject to any disclaimer, the term of this patent is extended or adjusted under 35 U.S.C. 154(b) by 256 days.

(21) Appl. No.: 10/970,289

(22) Filed: Oct. 21, 2004

(65) Prior Publication Data

US 2005/0117291 A1 Jun. 2, 2005

(30) Foreign Application Priority Data

Oct. 23, 2003 (JP) ............................. 2003-363924

(51) Int. Cl.
H05K 7/20 (2006.01)
H01L 23/36 (2006.01)

(52) U.S. Cl. ...................... 361/719; 361/704; 257/713

(58) Field of Classification Search ................ 361/687, 361/717–719, 704, 707; 257/707, 713
See application file for complete search history.

(56) References Cited

U.S. PATENT DOCUMENTS

| | | | | |
|---|---|---|---|---|
| 4,092,697 A * | 5/1978 | Spaight | ...................... | 361/718 |
| 4,381,032 A * | 4/1983 | Cutchaw | ...................... | 165/46 |
| 4,531,146 A * | 7/1985 | Cutchaw | ...................... | 257/713 |
| 4,602,678 A * | 7/1986 | Fick | ...................... | 165/79 |
| 4,842,911 A * | 6/1989 | Fick | ...................... | 428/40.4 |
| 4,933,747 A * | 6/1990 | Schroeder | ...................... | 257/714 |
| 5,006,924 A * | 4/1991 | Frankeny et al. | ...................... | 257/714 |
| 5,168,348 A * | 12/1992 | Chu et al. | ...................... | 257/713 |
| 5,581,443 A * | 12/1996 | Nakamura et al. | ...................... | 361/705 |
| 5,608,610 A * | 3/1997 | Brzezinski | ...................... | 361/704 |
| 5,661,637 A * | 8/1997 | Villaume | ...................... | 361/687 |
| 6,212,074 B1 * | 4/2001 | Gonsalves et al. | ...................... | 361/717 |
| 6,226,184 B1 * | 5/2001 | Stolz et al. | ...................... | 361/704 |
| 6,324,055 B1 * | 11/2001 | Kawabe | ...................... | 361/687 |
| 6,411,513 B1 * | 6/2002 | Bedard | ...................... | 361/704 |
| 6,496,373 B1 * | 12/2002 | Chung | ...................... | 361/705 |
| 6,652,958 B2 * | 11/2003 | Tobita | ...................... | 428/298.1 |
| 6,956,739 B2 * | 10/2005 | Bunyan | ...................... | 361/700 |
| 6,965,071 B2 * | 11/2005 | Watchko et al. | ...................... | 174/377 |
| 7,019,976 B1 * | 3/2006 | Ahmad et al. | ...................... | 361/704 |
| 7,063,127 B2 * | 6/2006 | Gelorme et al. | ...................... | 165/80.2 |
| 7,109,581 B2 * | 9/2006 | Dangelo et al. | ...................... | 257/720 |
| 2002/0090501 A1 * | 7/2002 | Tobita | ...................... | 428/297.4 |

FOREIGN PATENT DOCUMENTS

| | | |
|---|---|---|
| JP | 09-113158 | 5/1997 |
| JP | 10-229287 | 5/1998 |
| JP | 2002-217343 | 8/2002 |
| JP | 2003-037228 | 2/2003 |
| JP | 2003-168882 | 6/2003 |
| JP | 2003-298258 | 10/2003 |

* cited by examiner

*Primary Examiner*—Anatoly Vortman
(74) *Attorney, Agent, or Firm*—Oblon, Spivak, McClelland, Maier & Neustadt, P.C.

(57) ABSTRACT

An electronic device is thin and includes heat-generating components that are cooled efficiently. The electronic device includes heat-transmitting sheets 72 and 47 being stuck to inside surfaces of a lower section and an upper section of the electronic device's case and in contact with heat-generating components, which are semiconductor components such as an image processor and a central processor mounted on both sides of a motherboard provided in the case, and elastic sheets, which are laid between the portions, contacting the heat-generating components, of the heat-transmitting sheets and the inside surfaces of the sections.

14 Claims, 25 Drawing Sheets

ELECTRONIC DEVICE

BACKGROUND OF THE INVENTION

1. Field of the Invention

This invention relates to an electronic device whose heat-generating components are disposed in its case. More specifically, this invention relates to an electronic device whose cooling mechanism for heat-generating components is engineered so as not to prevent the device from being made thin and light.

2. Description of the Related Art

Notebook computers have been known for some time as an electronic device with a body and a display which can freely be opened away from the body and closed onto the body.

For example, patent document 1 discloses a notebook computer. A chassis is put in the case of the body, and an optical-disk device, a battery, etc. are housed in the chassis. Fitted to the bottom surface of the chassis is a motherboard on which a central processor, a hard-disk drive, and various connectors are mounted.

Heat generated by the central processor, etc. is transmitted to the chassis of die-cast magnesium and diffused through the chassis.

[Patent Document 1] Japanese Unexamined Patent Publication No. 2002-108505

The box-like chassis of the notebook computer of the patent literature 1 serves as a heat sink. As a result, no fan or separate heat sink is required. However, the chassis has a three-dimensional construction for strong rigidity against bending and twisting, preventing the computer from being made thin.

SUMMARY OF THE INVENTION

Accordingly, the object of the present invention is to provide an electronic device which is thin and whose heat-generating components are cooled efficiently.

The electronic device of the present invention is characterized by heat-transmitting sheets, which are stuck to the inside of the case of the device and in contact with heat-generating components, and elastic sheets, which are laid between the portions, contacting the heat-generating components, of the heat-transmitting sheets and the inside of the case.

As the heat-transmitting sheets are thin sheets, they contribute to the reduction of thickness and weight of the electronic device. Besides, because the elastic sheets press the heat-transmitting sheets onto the heat-generating components, the heat-generating components are put in close contact with the heat-transmitting sheets. Thus, air is precluded from between the heat-generating components and the heat-transmitting sheets and the heat from heat-generating components is diffused efficiently through the heat-transmitting sheets.

Moreover, if heat-generating components are disposed near the back side of the body and the input unit is disposed near the front side of the body, less heat is transmitted from the heat-generating components to the input unit, less annoying the user. Besides, the user can operate keys without touching the area of the case heated by the heat-generating components.

Furthermore, if heat-generating components are disposed about the center between the right and left sides of the case, less heat is transmitted to the user's hands which tend to be positioned near the right and left sides of the keyboard. When the user moves the electronic device with the display opened by holding the right and left sides of the part of the body behind the keyboard, less heat is transmitted from the heat-generating components to the hands of the user.

If the most heat-generating component is mounted on the bottom surface of a circuit board, less heat is transmitted to the top side of the body, less annoying the key-operating user.

The electronic device of the present invention has heat-transmitting sheets, which are stuck to the inside of the case of the device and in contact with heat-generating components, and elastic sheets, which are laid between the portions, contacting the heat-generating components, of the heat-transmitting sheets and the inside of the case; accordingly, damage to heat-generating components and a circuit board on which the heat-generating components are mounted is prevented and the heat-generating components are cooled efficiently while the electronic device is made thin and light. If a portable electronic device is made thin and light, the user can easily carry it.

Besides, the heat-transmitting sheets are sufficiently larger than the heat-generating components and, except the portions with elastic sheets, directly stuck onto the inside surface of the case; therefore, the heat from the heat-generating components is diffused efficiently through the heat-transmitting sheets and the case.

Accordingly, the electronic device of the present invention is thin and light and has sufficient cooling capacity without a cooling device such as a heat sink or a cooling fan.

Moreover, if the case warps under external pressure, the elastic sheets serve as buffers to prevent damage to the heat-generating components and the circuit board on which the heat-generating components are mounted.

Furthermore, by laying insulating sheets between the heat-generating components and the heat-transmitting sheets or between the heat-transmitting sheets and the inside surface of the case, short circuits between the heat-generating components or the circuit board on which heat-generating components are mounted and the heat-transmitting sheets or the case are prevented.

DESCRIPTION OF THE PREFERRED EMBODIMENTS

Now, an embodiment of electronic device in accordance with the present invention will be described below. The embodiment is a notebook computer.

Figure 1:
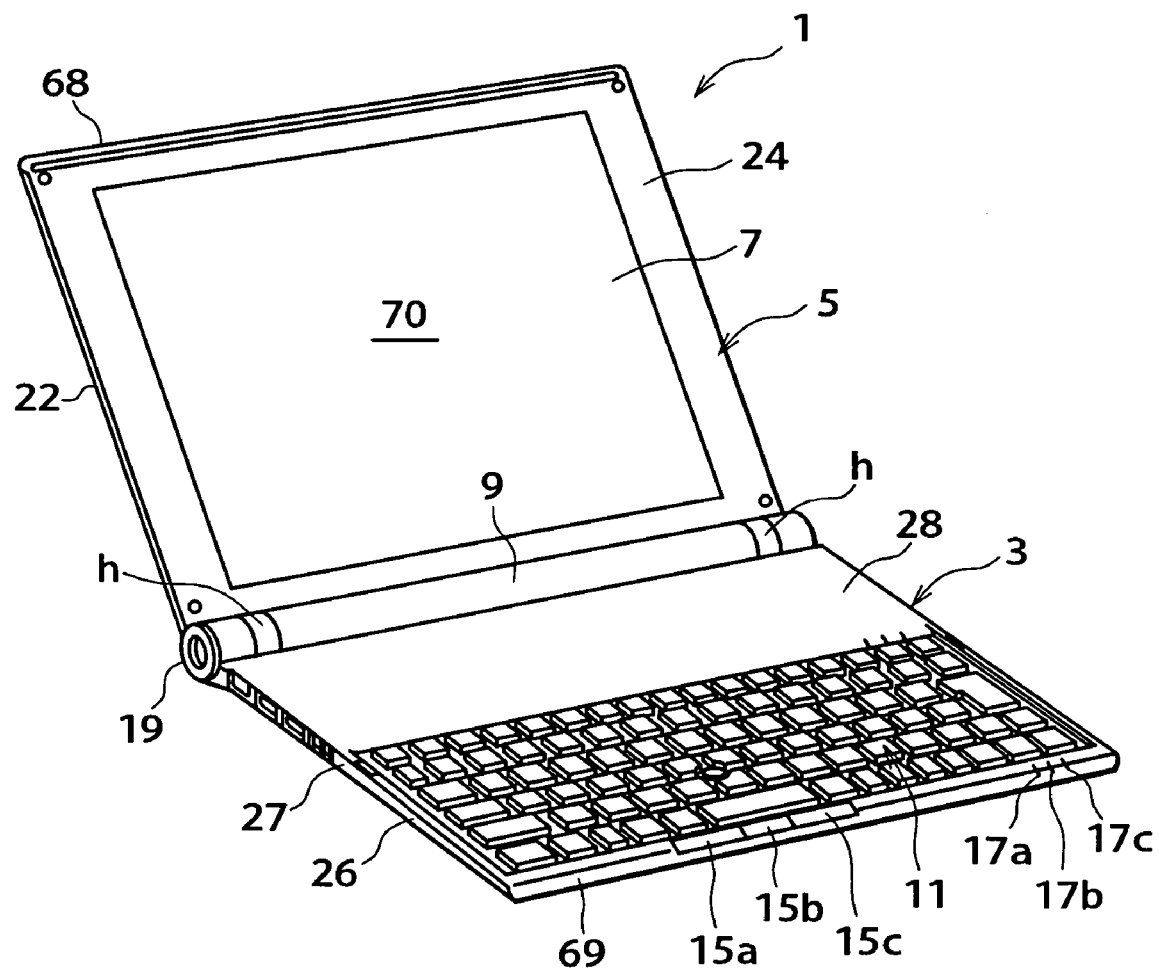
FIG. 1 is a perspective view of an electronic device according to an embodiment of the invention in an opened state.
Figure 2:
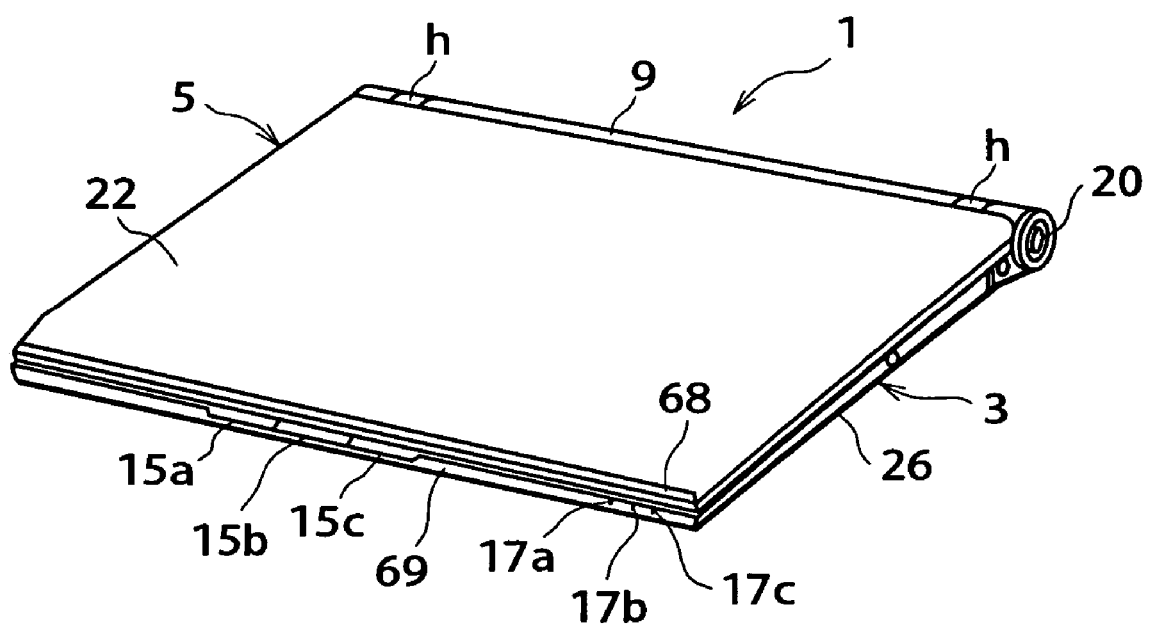
FIG. 2 is a perspective view of the electronic device in a closed state.

FIGS. 1 and 2 show the outer appearances of the electronic device 1 of the present embodiment. The electronic device 1 comprises a body 3, a display 5, and two hinges "h" which fasten the display 5 to the body 3.

The display 5 pivots on the hinges "h" to open away from the body 3 and close onto the body 3. In FIG. 1, the display 5 is opened away from the body 3. In FIG. 2, the display 5 is closed onto the body 3.

Figure 5:
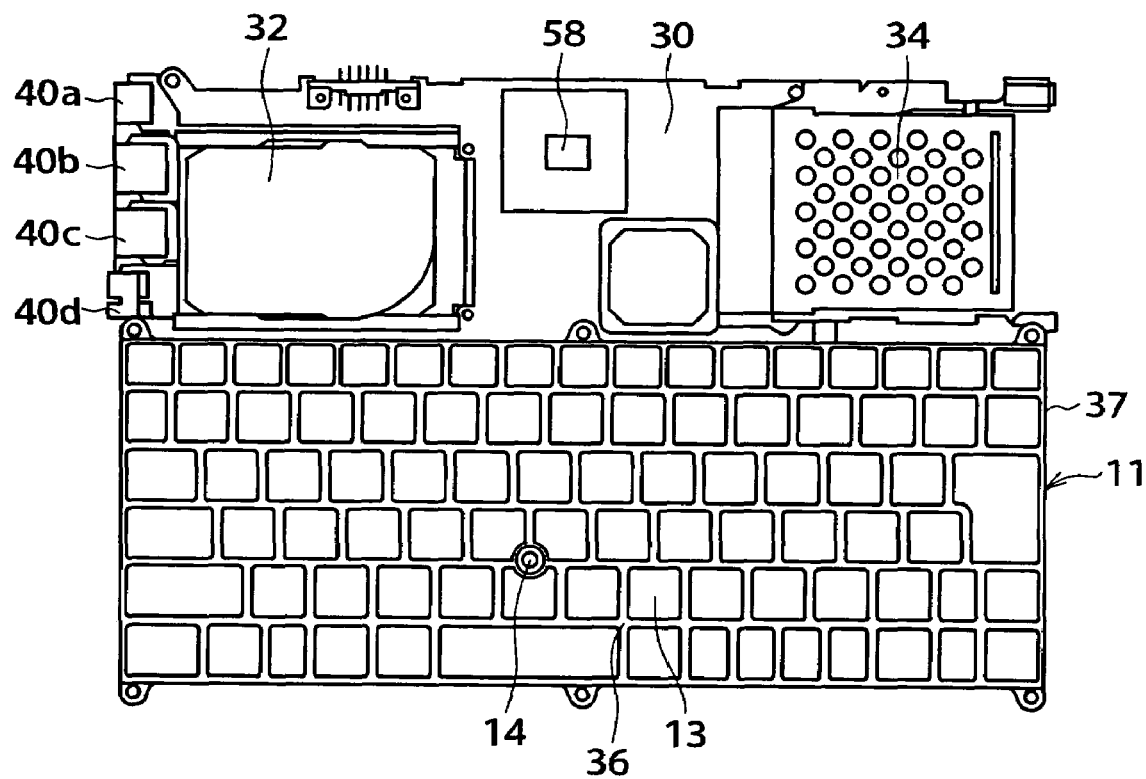
FIG. 5 is a plan view of the built-in components disposed in the case 26.

The body 3 has a case 26. Disposed in the case 26 as shown in FIG. 5 are a keyboard 11, a motherboard 30, a hard-disk drive 32, a PC card slot 34, and connectors 40a–d.

The keyboard 11 is an input unit of the electronic device 1. The motherboard 30 is the substantially main functional component of the electronic device 1 and receives signals inputted through the keyboard 11 and makes various kinds of processing such as arithmetic processing, control processing, image processing, and processing to output signals to the display 5.

The motherboard 30 serves as a control circuit board to control individual components such as the keyboard 11 and the display 5, too.

Figure 3:
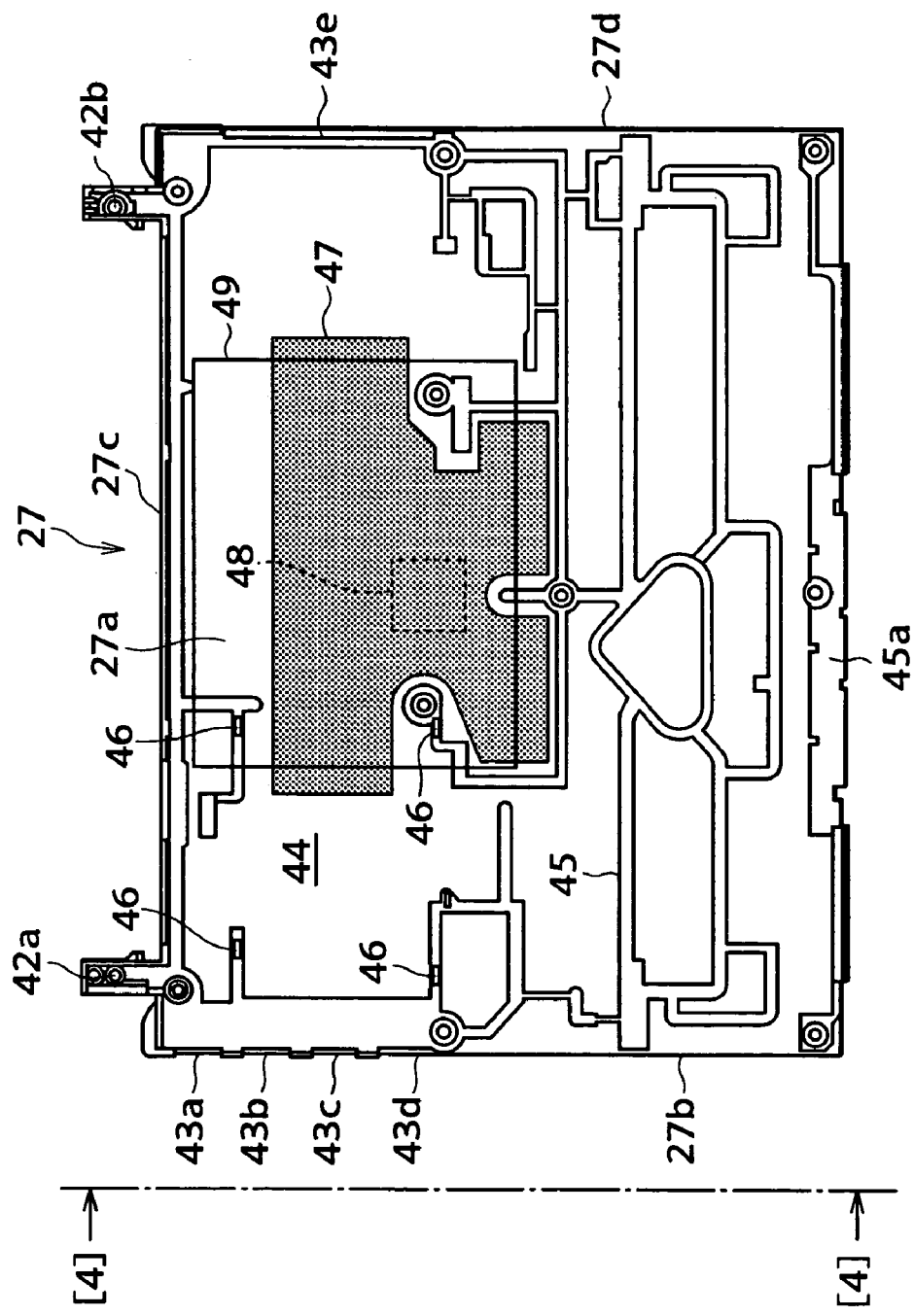
FIG. 3 is a plan view of the inside of a lower section 27 of a case 26 of the electronic device.

The case 26 comprises an upper section 28 and a lower section 27. FIG. 3 is a plan view of the inside of the lower section 27.

Figure 4:
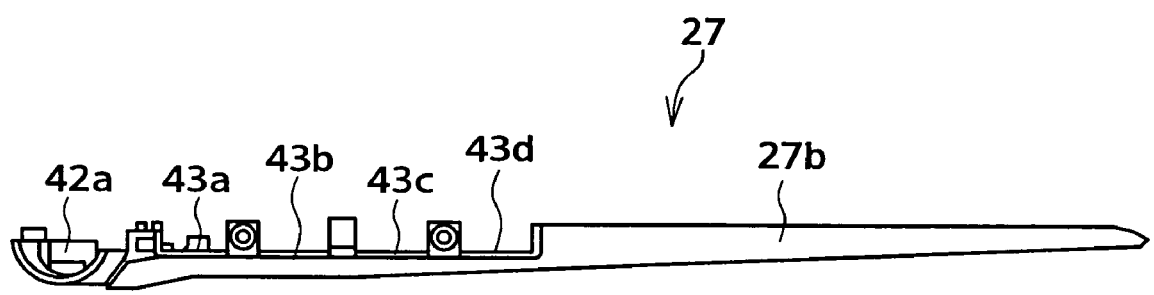
FIG. 4 is a side view of the lower section 27 as seen along the arrows [4] and [4] of FIG. 3.

FIG. 4 is a side view of the lower section 27 as seen along the arrows [4] and [4] of FIG. 3.

The lower section 27 looks like a flat box and has an almost rectangular bottom plate 27a, right and left side plates 27b and 27d, and a back plate 27c. As shown in FIGS. 3 and 4, the side and back plates 27b–d are erected on the three sides of the bottom plate 27a.

The back plate 27c is erected on the back side of the bottom plate 27a and has outward-protruding constituent parts 42a and 42b of the hinges "h" as shown in FIGS. 3 and 4.

As shown in FIGS. 3 and 4, there are cuts 43a–d in the left side plate 27b for the connectors 40a–d and a cut 43e in the right side plate 27d for the PC card slot 34.

The inside of the bottom plate 27a is provided with a resin mold 45, which is raised from the inside surface of the bottom plate 27a to reinforce the lower section 27 against bending and twisting.

A heat-transmitting sheet 47 is stuck on the inside surface of the bottom plate 27a. The heat-transmitting sheet 47 is positioned near to the center between the right and left sides of the bottom plate 27a and one-sided toward the back side of the bottom plate 27a.

The heat-transmitting sheet 47 is, for example, a graphite sheet 0.1 to 1.0 mm thick. Because the heat-transmitting sheet 47 is positioned in an area where the mold 45 does not exist, the heat-transmitting sheet 47 does not float, but is closely stuck onto the inside of the bottom plate 27a; accordingly, the heat from heat-generating components to be described later is diffused effectively through the lower section 27. Besides, the heat-transmitting sheet 47 is sufficiently larger than the heat-generating components and an elastic sheet 48 to be described later.

An elastic sheet 48 is laid between the heat-transmitting sheet 47 and the bottom plate 27a. The elastic sheet 48 is rectangular and larger than the heat-generating components. However, the elastic sheet 48 may be as large as, or smaller than, the heat-generating components. The elastic sheet 48 is positioned in the center between the left and right sides of the bottom plate 27a and one-sided toward the back side of the bottom plate 27a.

To be specific, the elastic sheet 48 is 0.5–3.0 mm thick and made of Poron (of Rogers Inoac Corporation) which is high-density polyurethane foam whose cells are fine and uniform.

An insulating sheet 49 is overlaid on the heat-transmitting sheet 47; accordingly, short circuits between the heat-transmitting sheet 47, which is made of graphite and conductive, and the motherboard, which is put on the heat-transmitting sheet 47, are prevented. The insulating sheet 49 may be laid between the heat-transmitting sheet 47 and the bottom plate 27a.

The insulating sheet 49 is, for example, a transparent thin film of polyphenylene sulfide. It is as thin as, for example, 0.05–0.3 mm; therefore, it does not prevent heat transmission from the heat-generating components to the heat-transmitting sheet 47.

The lower section 27 is made of CFRP (carbon fiber reinforced plastics). To be specific, the CFRP consists of six layers 51a, 51b, 52a, 52b, 53a, and 53b as shown in FIG. 26.

Figure 26A:
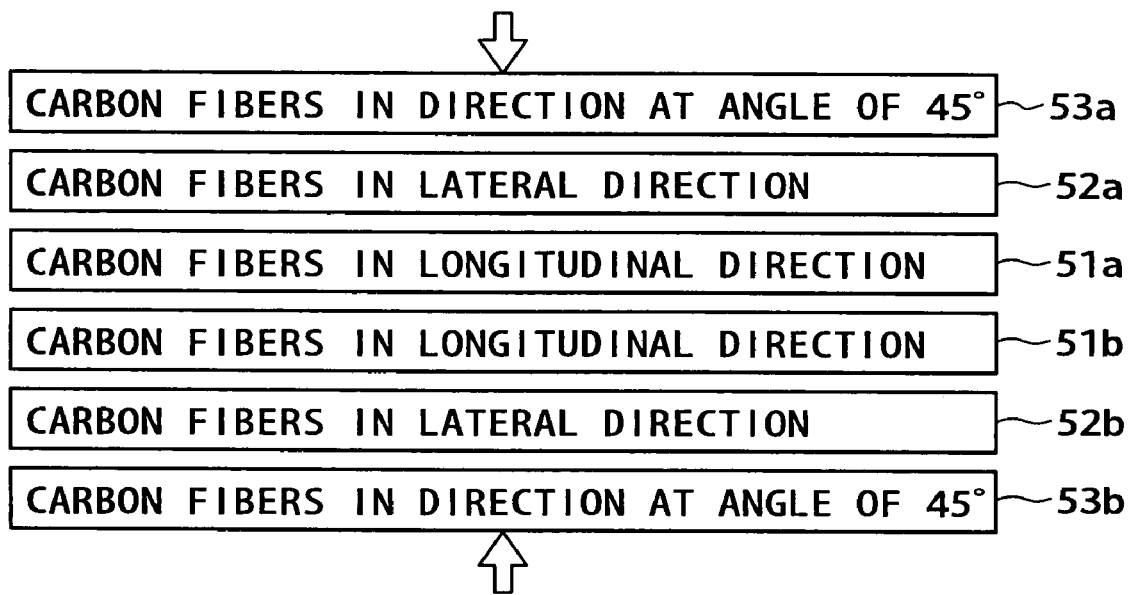
FIGS. 26A and 26B are schematic cross sections of the laminated structure of the case 22 of the electronic device according to the present embodiment.
Figure 26B:
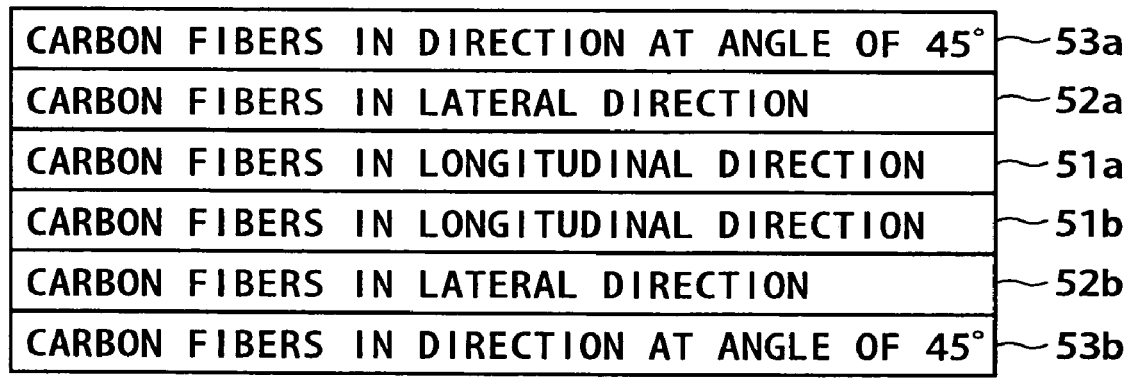

As shown in FIG. 26A, the six layers 51a, 51b, 52a, 52b, 53a, and 53b are pressed together.

Each layer is made of long carbon fibers solidified by epoxy resin. All the fibers of each layer are put side by side in one and the same direction.

To be specific, the carbon fibers of the innermost layers 51a and 51b are laid in the longitudinal direction of the electronic device 1. Accordingly, the carbon fibers of the layer 51a are parallel to those of the layer 51b.

The carbon fibers of the intermediate layers 52a and 52b are laid in the lateral direction of the electronic device 1.

The carbon fibers of the outermost layers 53a and 53b are laid in the direction at angles of 45° with the longitudinal and lateral directions of the electronic device 1. Accordingly, the carbon fibers of the layer 53a are parallel to those of the layer 53b.

With the above laminated structure, the thin lower section 27 has sufficient strength. As the lower section 27 is thin, the electronic device 1 is also thin, which is an advantage for portable electronic devices in particular.

Figure 28A:
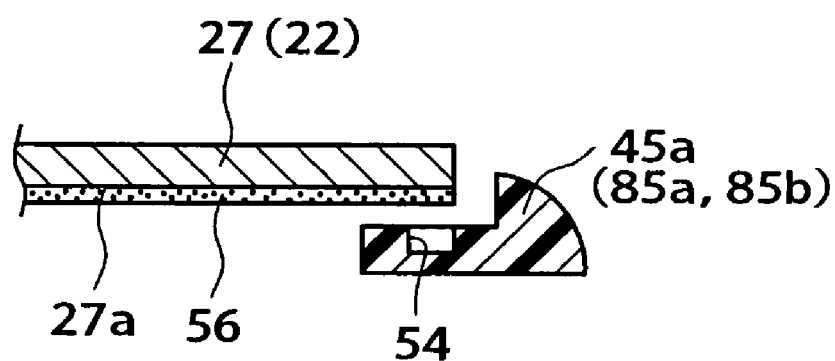
FIG. 28 shows a resin material being stuck onto edge portions of the laminated layers shown in FIG. 26.
Figure 28B:
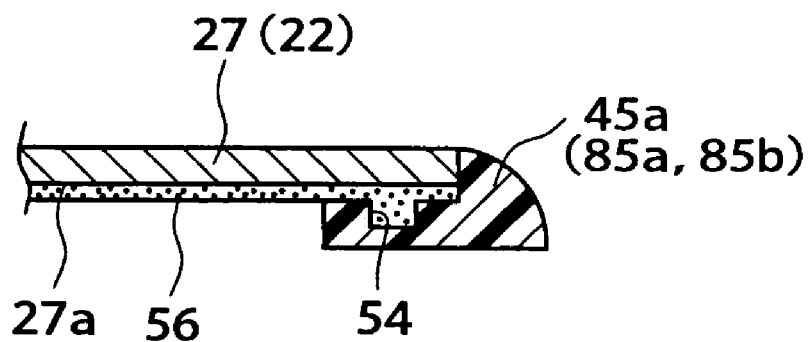

As shown in FIG. 28, an insulating layer 56 is formed on the inside surface of the bottom plate 27a. The insulating layer 56 is made of, for example, nylon (a trade name of Du Pont).

The insulating layer 56 prevents short circuits between the lower section 27, which is made of CFRP (carbon fiber reinforced plastics) containing conductive carbon fibers, and the motherboard 30 fitted in the lower section 27.

When the insulating layer 56 made of nylon is heated, it softens and becomes adhesive. By making use of the adhesiveness of the insulating layer 56, the mold 45 is stuck and fixed to the insulating layer 56. The mold 45 has bosses with threaded holes, etc.

As shown in FIG. 28, the front edge of the lower section 27 is provided with a resin cover 45a. By making use of the adhesiveness of the insulating layer 56, the cover 45a is stuck onto the insulating layer 56 to cover the front edge of the lower section 27. Thus, loose ends of carbon fibers, if any, at the front edge of the lower section 27 are covered up.

As shown in FIG. 3, because the resin cover 45a extends along the front edge of the lower section 27, it serves as a beam, too, reinforcing the lower section 27 against bending and twisting.

The resin cover 45a and the mold 45 are made of nylon as well as the insulating layer 56; accordingly, the cover 45a and the mold 45 are stuck on the insulating layer 56 sufficiently. As shown in FIG. 28, a groove 54 is made in the surface of the resin cover 45a which comes in contact with the insulating layer 56. When the insulating layer 56 is heated and softened and the cover 45a is stuck on the insulating layer 56, surplus softened, adhesive nylon enters into the groove 54.

Thus, the surplus softened, adhesive nylon is prevented from leaking out through the joint between the lower section 27 and the cover 45a. If the surplus softened, adhesive nylon leaks out, the appearance of the electronic device 1 is spoiled.

Because the right and left side plates 27b and 27d are erected on the right and left sides, respectively, and the back plate 27c is erected on the back side of the bottom plate 27a, these plates 27b, 27c, and 27d play the role of the cover 45a.

Figure 6:
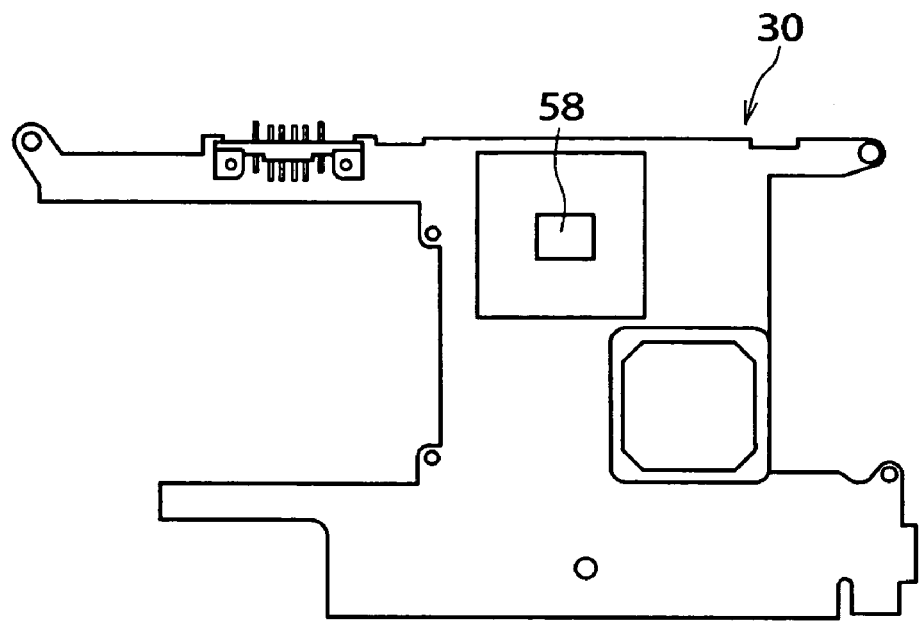
FIG. 6 is a plan view of one surface of a motherboard to be fitted into the case 26.
Figure 7:
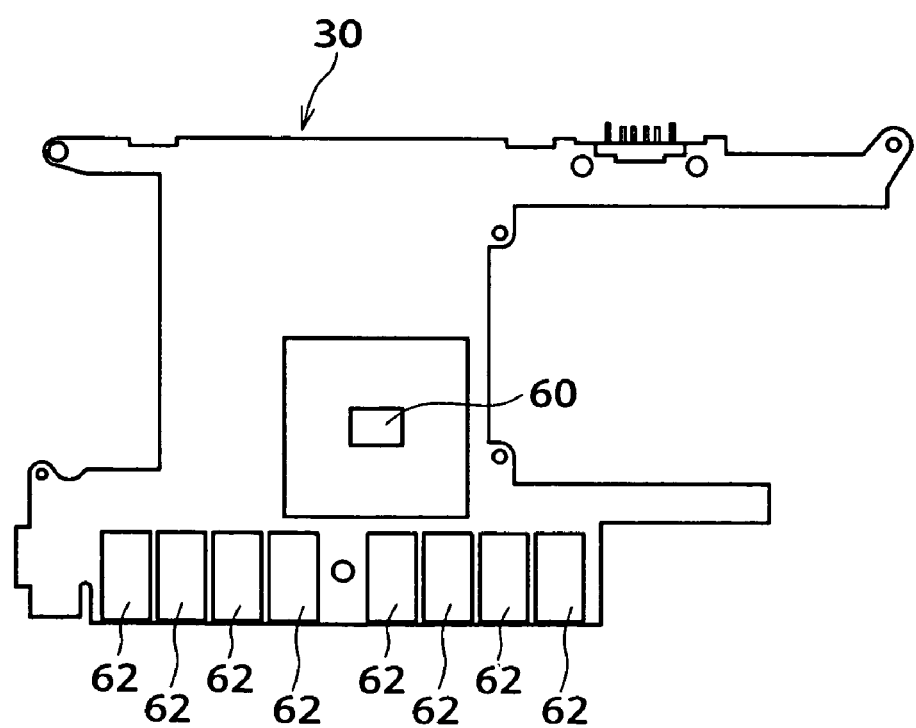
FIG. 7 shows the other surface of the motherboard shown in FIG. 6.

Now, the motherboard to be fitted in the lower section 27 will be described below by referring to FIGS. 6 and 7. FIG. 6 shows the upper surface of the motherboard 30; FIG. 7, the lower surface. A central processor 58 is mounted on the upper surface. An image processor 60 and a plurality of semiconductor memories 62 are mounted on the lower surface. Although not shown in FIGS. 6 and 7, many other components are mounted on both the surfaces of the motherboard 30.

The central processor 58 and the image processor 60 are semiconductors and generate heat when they function. The central processor 58 and the image processor 60 are so positioned that they do not overlap with each other.

The motherboard 30 comprises a multi-layer printed circuit board and the central processor 58, the image processor 60, the semiconductor memories 62, and other components (not shown) mounted on both the surfaces of a multi-layer printed circuit board and is the substantial body of the electronic device 1 in terms of functions of the electronic device 1.

The multi-layer printed circuit board is made by the buildup method as follows. A two-layer printed circuit board (hereinafter "intermediate two-layer printed circuit board") is laid on each of the upper and lower surfaces of an innermost two-layer printed circuit board. A single-layer printed circuit board is laid on the upper surface of the upper intermediate two-layer printed circuit board; a single-layer printed circuit board, on the lower surface of the lower intermediate two-layer printed circuit board. A single-layer printed circuit board is laid on the upper surface of the upper single-layer printed circuit board; a single-layer printed circuit board, on the lower surface of the lower single-layer printed circuit board. Thus, a ten-layer printed circuit board is made. The buildup method enables us to do wiring efficiently and high-density mounting of parts.

Figure 8:
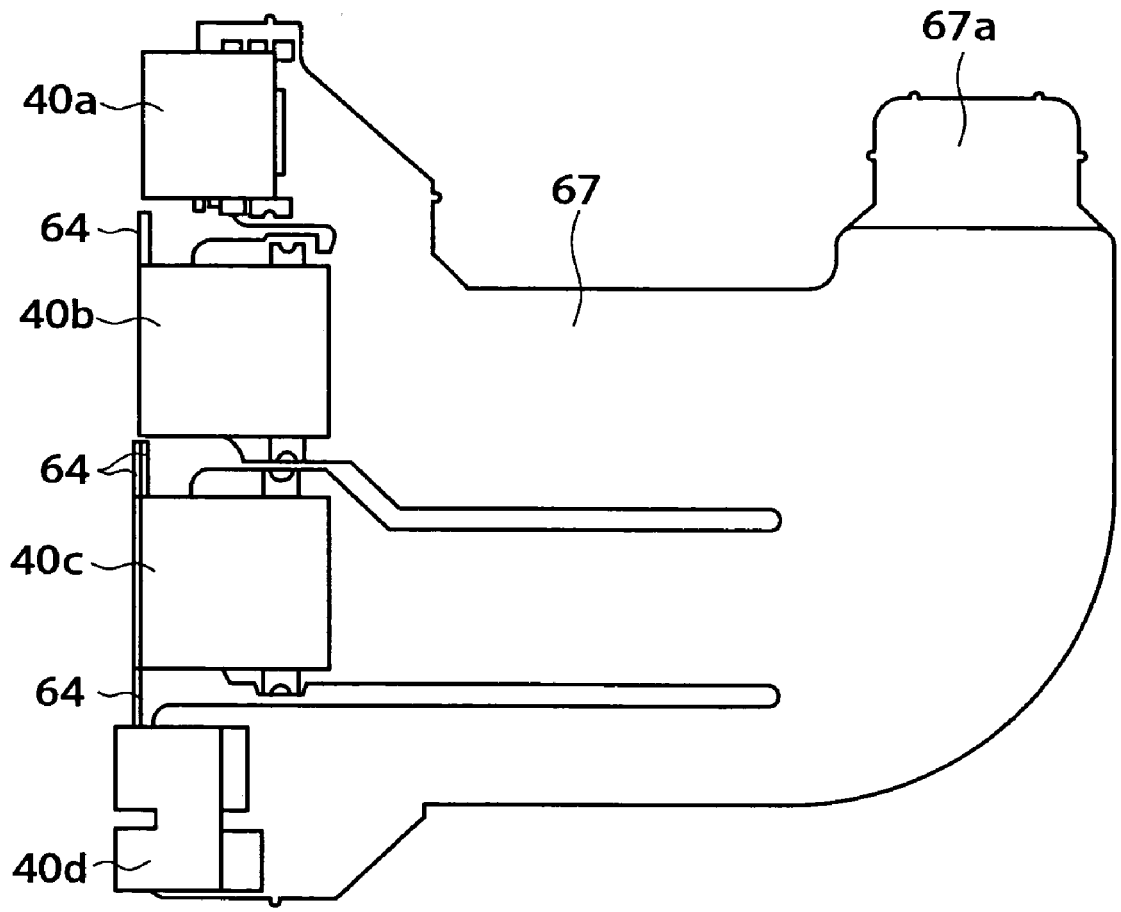
FIG. 8 is a plan view of connectors and a flexible wiring board provided in the case 26.
Figure 9:
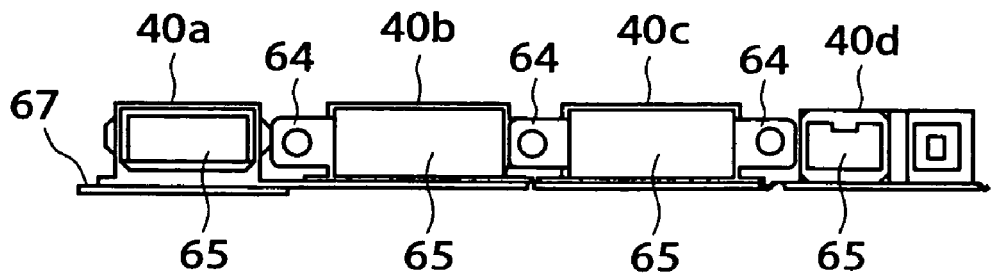
FIG. 9 is a front view of the connectors and the flexible wiring board of FIG. 8.
Figure 10:
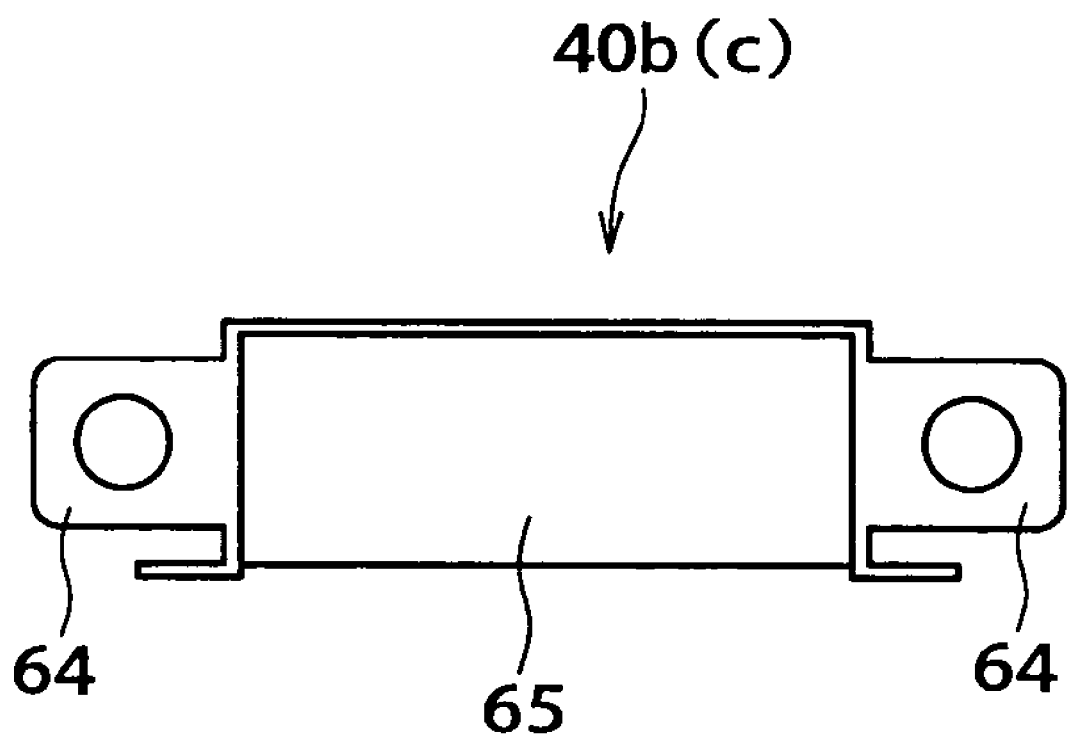
FIG. 10 is an enlarged front view of the connectors shown in FIGS. 8 and 9.

The connectors 40a–d shown in FIGS. 8–10 are also fitted in the lower section 27. The connectors 40a–d are connected to the motherboard 30 through a flexible wiring board 67. Namely, the connectors 40a–d are connected to wires at one end of the flexible wiring board 67, and the other end 67a of the flexible wiring board 67 is inserted into a connector mounted on the motherboard 30.

As shown in FIG. 10, the connector 40b is provided two flanges 64 protruding from the right and left shorter sides of its socket. By fixing the flanges 64 to the left side plate 27b by using, for example, screws, the connector 40b can be fixed to the left side plate 27b. The connector 40c has the same flanges 64 as the connector 40b.

Figure 11:
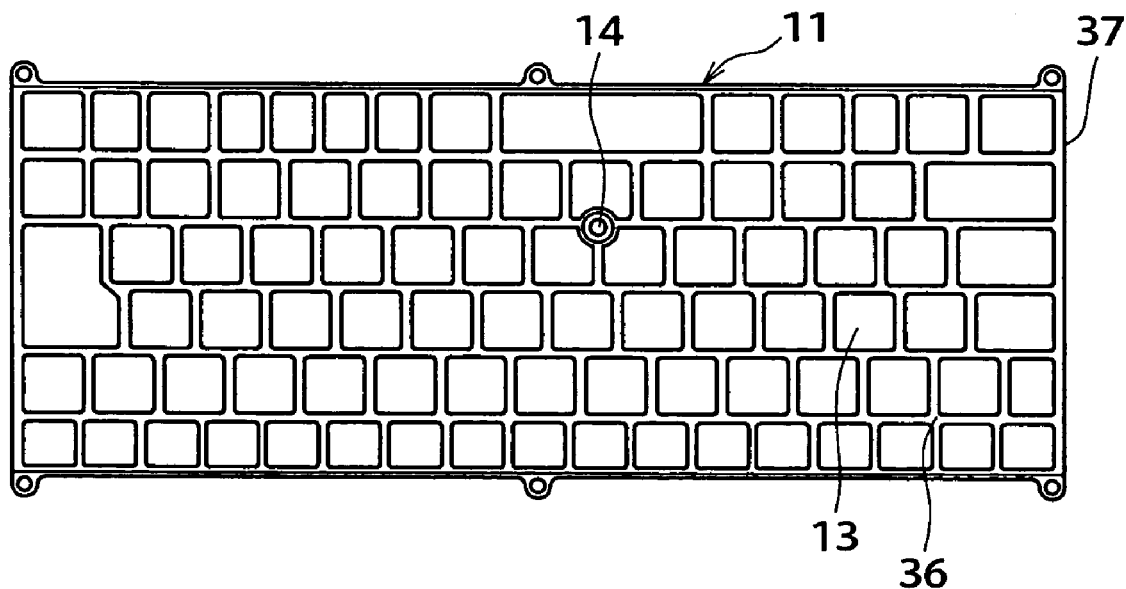
FIG. 11 is a plan view of a keyboard fitted into the case 26.
Figure 12:
FIG. 12 is a front view of the keyboard.
Figure 13:
FIG. 13 is a rear view of the keyboard.
Figure 14:
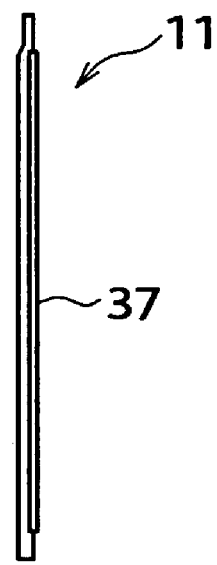
FIG. 14 is a left-side view of the keyboard.
Figure 15:
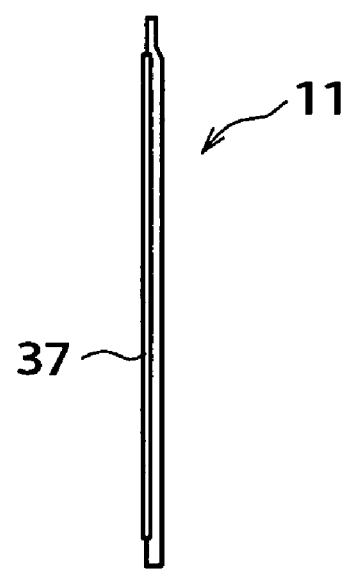
FIG. 15 is a right-side view of the keyboard.
Figure 16:
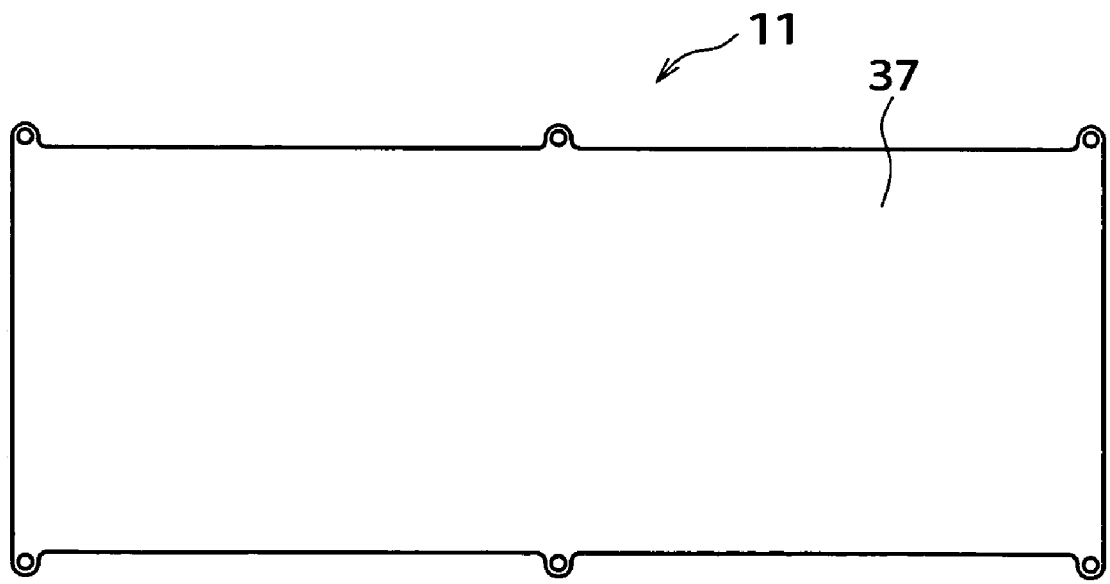
FIG. 16 is a back side view of the keyboard.

The keyboard 11 shown in FIGS. 11–16 is fitted to the lower section 27. FIG. 11 is a plan view of the keyboard 11. FIGS. 12 and 13 are front and rear views, respectively, of the keyboard 11. FIGS. 14 and 15 are left and right side views, respectively, of the keyboard 11. FIG. 16 is a bottom view of the keyboard 11.

The keyboard 11 comprises a case 37, input keys 13, a pointing device 14 called "track point," and a cover 36.

The case 37 is made of, for example, magnesium and in the shape of a flat box, having a key-arrangement area and side plates erected around the key-arrangement area.

The key-arrangement area is in the shape of an almost rectangular flat plate and the side plates are formed, as a single piece, at the right, left, top, and bottom sides of the key-arrangement area.

As described above, the case 37 is not a flat plate, but in the shape of a flat box, having the side plates; accordingly, its rigidity is high. When a user presses keys 13, the case 37 does not warp, giving good repulsion to the fingers of the user. Thus, the feeling of key operation is good.

The four sides of each key of an ordinary keyboard are inclined, whereas the four sides of input keys 13 are not inclined. Accordingly, the occupancy area of each input key 13 is smaller than that of an ordinary key. Accordingly, the gaps between input keys 13 can be widened to prevent the user from pressing wrong input keys 13.

The cover 36 has cuts in it, and the input keys 13 and the pointing device 14 are exposed through the cuts. The key-arrangement area is covered with the cover 36. Thus, the gaps between input keys 13 are covered and, hence, dust and water are prevented from entering through the gaps. The cover 36 and the input keys 13 are made of, for example, ABS resin.

Figure 17:
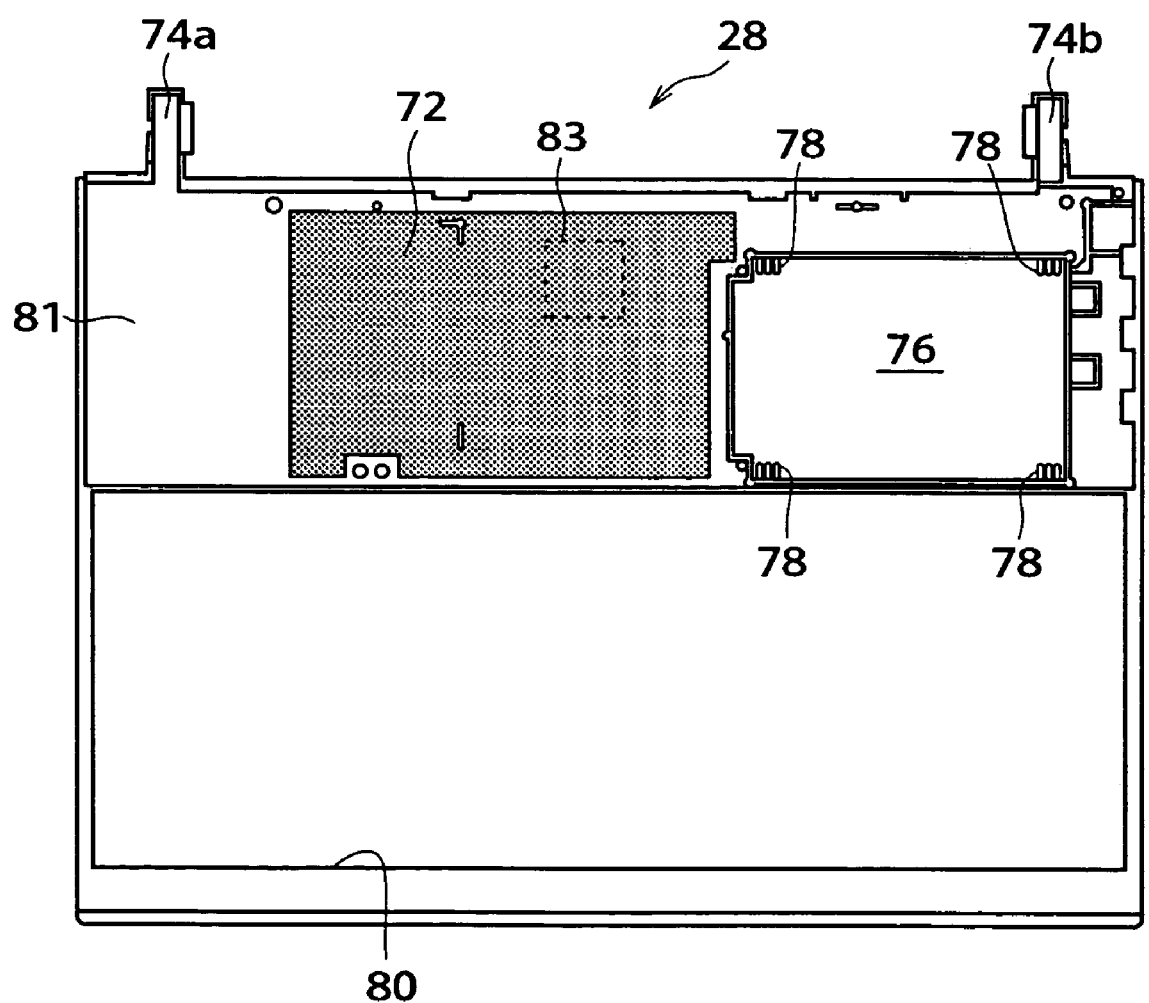
FIG. 17 is a plan view of the inside of the upper section 28 of the case 26.

Now, the upper section 28 of the case 26 will be described below by referring to FIG. 17. FIG. 17 is a plan view of the inside of the upper section 28 which faces the inside of the lower section 27 shown in FIG. 3.

The upper section 28 is almost rectangular and has approximately the same area as the lower section 27. The upper section 28 has a large cut 80 in its front area wherein the input keys 13 and the pointing device 14 are arranged.

The reference numeral 81 in FIG. 17 is a covered area. Outward-protruding constituent parts 74a and 74b of the hinges "h" are formed at the back side of the covered area 81.

A heat-transmitting sheet 72 is stuck to the inside of the covered area 81. The heat-transmitting sheet 72 is positioned near to the center between the right and left sides of the covered area 81.

The heat-transmitting sheet 72 is made of, for example, graphite and 0.1–1.0 mm thick. The heat-transmitting sheet 72 is shaped and has cuts in it so as to avoid bosses and ribs erected inside the covered area 81. Thus, the covered area 81 is not floated over the inside surface of the covered area 81, but closely stuck onto the inside surface; accordingly, the heat from heat-generating components is effectively diffused through the upper section 28.

An elastic sheet 83 is laid between the heat-transmitting sheet 72 and the inside surface of the covered area 81. The elastic sheet 83 is rectangular and larger than the heat-generating components in contact with the heat-transmitting sheet 72. However, the elastic sheet 83 may be as large as, or smaller than, the heat-generating components so long as the heat from the heat-generating components can sufficiently be transmitted to the heat-transmitting sheet 72. The elastic sheet 83 is positioned near to the center between the right and left sides of the covered area 81.

To be specific, the elastic sheet 83 is 0.5–3.0 mm thick and made of Poron (of Rogers Inoac Corporation) which is high-density polyurethane foam whose cells are fine and uniform.

An insulating sheet (not shown) is overlaid on the heat-transmitting sheet 72; accordingly, short circuits between the heat-transmitting sheet 72, which is made of graphite and conductive, and the motherboard 30, which is put on the heat-transmitting sheet 72, are prevented. The insulating sheet may be laid between the heat-transmitting sheet 72 and the covered area 81.

The insulating sheet is, for example, a transparent film of polyphenylene sulfide. It is as thin as, for example, 0.05–0.3 mm; therefore, it does not prevent heat transmission from the heat-generating components to the heat-transmitting sheet 72.

The lower section 27 and the upper section 28 are coupled by, for example, screws. At this time, the keyboard 11, motherboard 30, hard-disk drive 32, and PC card slot 34 are fitted in the inside of the lower section 27.

Figure 18:
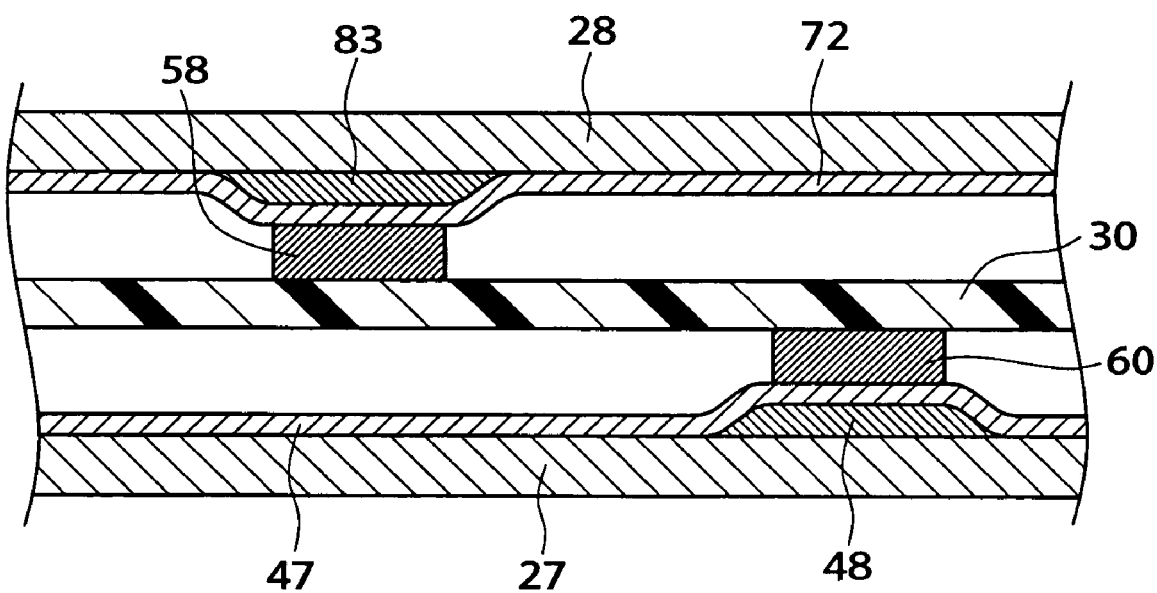
FIG. 18 is a schematic cross section of the inside of the case 26 where heat-generating components are placed.

The cooling mechanism for the central processor 58 and the image processor 60, which are mounted on the upper and lower surfaces, respectively, of the motherboard 30 and generate heat, will be described below by referring to FIG. 18.

The lower surface, on which the image processor 60 is mounted, of the motherboard 30 faces the inside of the lower section 27. The upper surface, on which the central processor 58 is mounted, faces the inside of the upper section 28.

The image processor 60 is in contact with the part of the heat-transmitting sheet 47 raised by the elastic sheet 48. In this way, the image processor 60 is put in close contact with the heat-transmitting sheet 47 by the elasticity of the elastic sheet 48. Thus, air is precluded from between the image processor 60 and the heat-transmitting sheet 47 and the heat from the image processor 60 is efficiently transmitted to the heat-transmitting sheet 47.

If the lower section 27 warps under external pressure, the elastic sheet 48 serves as a buffer. Thus, damage to the image processor 60 and the motherboard 30, electric-contact failure, etc. are prevented.

The heat transmitted to the heat-transmitting sheet 47 is diffused through the heat-transmitting sheet 47 and the lower section 27. Thus, overheat of the image processor 60 is prevented.

Because the heat-transmitting sheet 47 is sufficiently larger than the image processor 60, heat is diffused effectively.

The central processor 58 is in contact with the part of the heat-transmitting sheet 72 lowered by the elastic sheet 83. In this way, the central processor 58 is put in close contact with the heat-transmitting sheet 72 by the elasticity of the elastic sheet 83. Thus, air is precluded from between the central processor 58 and the heat-transmitting sheet 72 and the heat from the central processor 58 is efficiently transmitted to the heat-transmitting sheet 72.

If the upper section 28 warps under external pressure, the elastic sheet 83 serves as a buffer. Thus, damage to the central processor 58 and the motherboard 30, electric-contact failure, etc. are prevented.

The heat transmitted to the heat-transmitting sheet 72 is diffused through the heat-transmitting sheet 72 and the upper section 28. Thus, overheat of the central processor 58 is prevented.

Because the heat-transmitting sheet 72 is sufficiently larger than the central processor 58, heat is diffused effectively.

The central processor 58 and the image processor 60 are so positioned that they do not overlap with each other and, hence, the heat from the central processor 58 and the image processor 60 is not concentrated at a single spot. Beside, this arrangement of the central processor 58 and the image processor 60 enables the reduction of the distance between the lower section 27 and the upper section 28 and, hence, the reduction of the body 3.

The semiconductor memories 62 (see FIG. 7) mounted on the lower surface of the motherboard 30 are also in contact with the heat-transmitting sheet 47 and their heat is diffused through the heat-transmitting sheet 47. Heat-generating components are not limited to the central processor 58 and the image processor 60. Other parts made of semiconductors, hard-disk drives, etc. may be heat-generating components.

As described earlier, an insulating sheet (not shown) is laid between the image processor 60 and the heat-transmitting sheet 47. The insulating sheet may be laid between the heat-transmitting sheet 47 and the lower section 27. In the same way, an insulating sheet (not shown) is laid between the CPU 58 and the heat-transmitting sheet 72. The insulating sheet may be laid between the heat-transmitting sheet 72 and the upper section 28.

The hard-disk drive 32, which is positioned to the left of the motherboard 30 in FIG. 5, will be described below.

As shown in FIG. 3, ribs 46 are formed in the four corners of a hard disk drive-mounting space 44 in the lower section 27. In addition, as shown in FIG. 17, ribs 78 are formed in the four corners of a hard disk drive-mounting space 76 in the upper section 28.

Accordingly, the hard-disk drive 32 is supported by the ribs 46 and 78, a gap of the height of ribs 78 kept between the top surface of the hard-disk drive 32 and the inside surface of the upper section 28, a gap of the height of ribs 46 kept between the bottom surface of the hard-disk drive 32 and the inside surface of the lower section 27.

There are small gaps in spots, where the connectors 40*a*–*d* (see FIG. 5) are mounted to expose their sockets, of the left side plates of the lower section 27 and the upper section 28. The inside and the outside of the case 26 are connected by the small gaps. The space in which the motherboard 30 is fitted and the outside of the case 26 can be connected by the small gaps and the gaps on and under the hard-disk drive 32.

Accordingly, the discharge of heat from the central processor 58 and the image processor 60 can be accelerated. Besides, the hard-disk drive 32 can be air-cooled.

The connectors 40*a*–*d* are connected to the motherboard 30 through the flexible wiring board 67 (see FIG. 8). The flexible wiring board 67 is routed through the gap between the bottom surface of the hard-disk drive 32 and the inside surface of the lower section 27.

Because the connectors 40*a*–*d* are not mounted directly on the motherboard 30, shock at the time of connection and disconnection of external cables to and from the connectors 40*a*–*d* is absorbed by the flexible wiring board 67. Thus, the shock is not transmitted to the motherboard 30, damage to and positional slippage of the motherboard 30 prevented.

As shown in FIGS. 8 and 9, the connectors 40*b* and 40*c* are disposed so that the right flange 64 of the connector 40*b* and the left flange 64 of the connector 40*c* overlap with each other. The two flanges 64 overlapping with each other are fixed to the left side plate of the lower section 27 with, for example, a screw. Thus, the space to mount the connectors 40*a*–*d* is saved by the space of one flange 64.

As shown in FIG. 5, the PC card slot 34 is disposed at the right side of the case 26. The PC card is the standards for card-type peripheral devices established jointly by PCMCIA (Personal Computer Memory Card International Association) and JEIDA (Japan Electronic Industry Development Association).

The keyboard 11 is disposed in the space along the front of the case 26. The input keys 13 and the pointing device 14 are exposed to the outside through the cut 80 in the upper section 28.

As described above, the motherboard 30, hard-disk drive 32, and PC card slot 34 are disposed in the space along the back of the case 26 and the keyboard 11 is disposed in the space along the front of the case 26.

Cuts are made in the right and left sides of the motherboard 30 to avoid the hard-disk drive 32 and the PC card slot 34. The keyboard 11 does not overlap with the central processor 58 or the image processor 60 mounted on the motherboard 30 or the hard-disk drive 32 or the PC card slot 34.

As described above, because built-in components are arranged without their overlapping with one another, the body 3 can be made thin.

Part of the motherboard 30 is placed under the keyboard 11, but the central processor 58 and the image processor 60, which account for a large part of the thickness of the motherboard 30, do not overlap with the keyboard 11. Accordingly, the body 3 is not prevented from being made thin. An insulating sheet made of, for example, polycarbonate is laid between the part of the motherboard 30 overlapping with the keyboard 11 and the keyboard 11 in order to prevent short circuits between the case 37 of conductive magnesium and the motherboard 30. The motherboard 30 and the keyboard 11 may be arranged so that they do not overlap with each other at all.

Because the heat-generating central processor 58 and image processor 60 do not overlap with the keyboard 11, the heat of neither the central processor 58 nor the image processor 60 is transmitted to the keyboard 11 to annoy the user.

Because the central processor 58 and the image processor 60 are disposed in the space along the back side of the case 26 and the keyboard 11 is disposed in the space along the front side of the case 26, the user can operate the keyboard 11 without touching the upper section 28 covering the central processor 58 and the image processor 60.

The central processor 58 and the image processor 60 are positioned near to the center between the right and left sides of the case 26; accordingly, less heat is transmitted from the central processor 58 and the image processor 60 to the user's right and left hands which tend to be positioned toward the right and left sides of the keyboard 11, respectively. When the user moves the electronic device 1 with the display 5 opened, the user holds the right and left sides of the part of the body 3 behind the keyboard 11; accordingly, less heat is transmitted from the central processor 58 and the image processor 60 to the hands of the user.

Because the most heat-generating image processor 60 is mounted on the lower surface of the motherboard 30, less heat is transmitted from the image processor 60 to the top, or keyboard, side of the body 3, less annoying the user.

Now, the display 5 will next be described. The display 5 comprises a case 22 (see FIG. 19), a liquid crystal panel 7 (see FIG. 21) housed in the case 22, and an inverter circuit board 93 (see FIG. 21).

Figure 19:
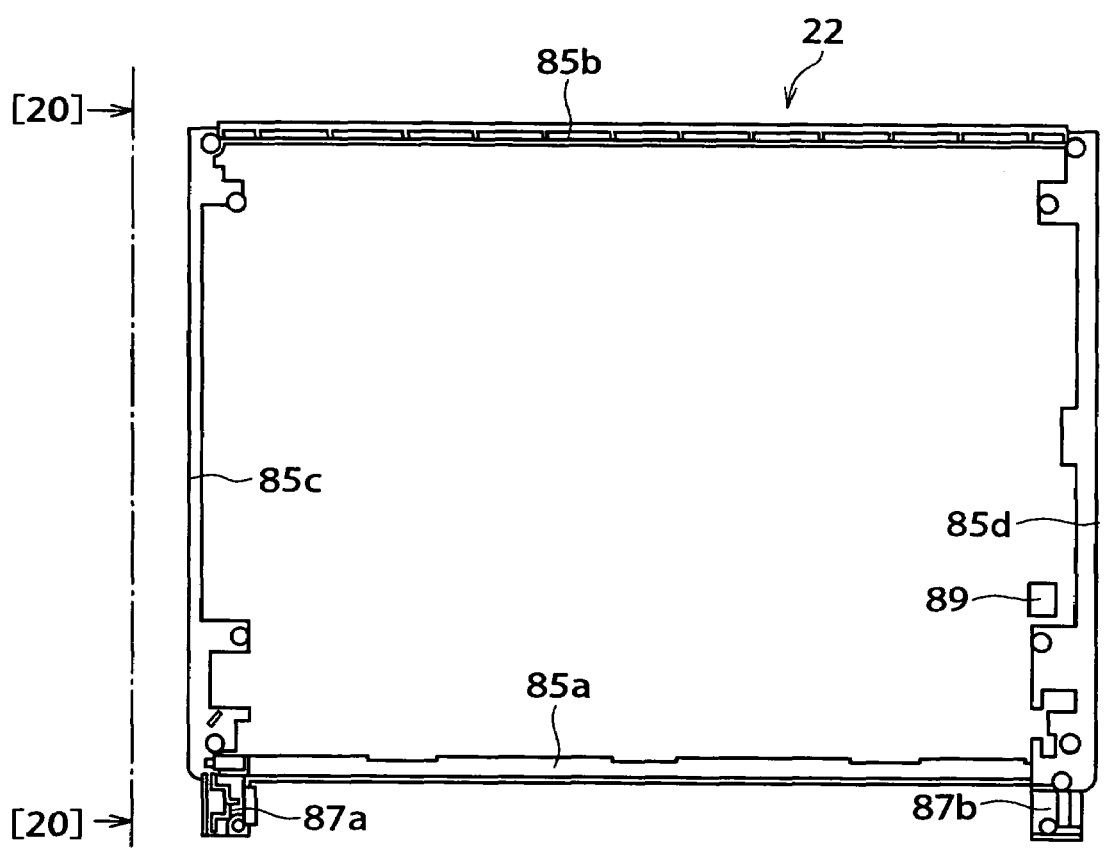
FIG. 19 is a plan view of the inside of a case 22.
Figure 20:
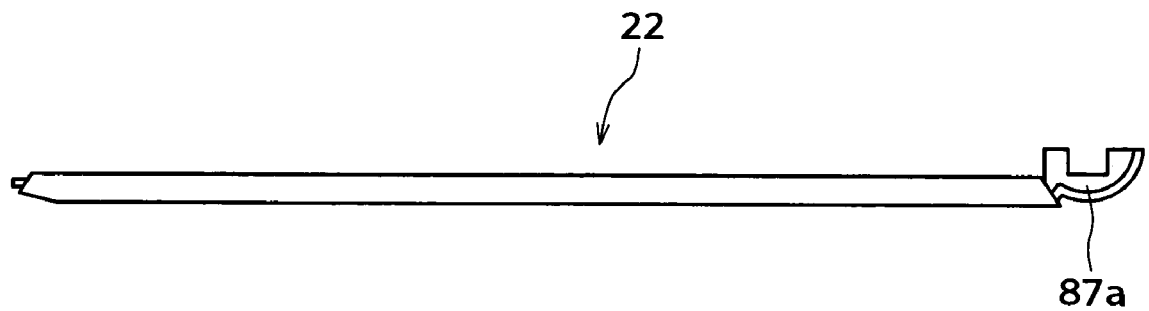
FIG. 20 is a side view of the case 22 as seen along the arrows [20] and [20] in FIG. 19.

FIG. 19 is a plan view of the inside of the case 22. FIG. 20 is a side view of the case 22 as seen along the arrows [20] and [20] in FIG. 19. The case 22 is almost rectangular and side plates are erected at the right and left sides of the case 22.

Outward-protruding constituent parts 87*a* and 87*b* of the hinges "h" are formed at the right and left ends of the back side of the case 22.

Molds 85*a*–*d* are provided inside the case 22. The molds 85*a*–*d* are disposed so that they enclose the four sides of the case 22 and reinforce the case 22 against bending and twisting.

In the same way as the lower section 27, the case 22 is made of CFRP (carbon fiber reinforced plastics). To be specific, the CFRP consists of six layers 51*a*, 51*b*, 52*a*, 52*b*, 53*a*, and 53*b* as shown in FIG. 26.

As shown in FIG. 26A, the six layers 51*a*, 51*b*, 52*a*, 52*b*, 53*a*, and 53*b* are pressed together.

Each layer is made of long carbon fibers solidified by epoxy resin. All the fibers of each layer are put side by side in one and the same direction.

To be concrete, the carbon fibers of the innermost layers 51*a* and 51*b* are laid in the longitudinal direction of the electronic device 1. Accordingly, the carbon fibers of the layer 51*a* are parallel to those of the layer 51*b*.

The carbon fibers of the intermediate layers 52*a* and 52*b* are laid in the lateral direction of the electronic device 1.

The carbon fibers of the outermost layers 53*a* and 53*b* are laid in the direction at angles of 45° with the longitudinal and lateral directions of the electronic device 1. Accordingly, the carbon fibers of the layer 53*a* are parallel to those of the layer 53*b*.

With the above laminated structure, the thin case 22 has sufficient strength. As the case 22 as well as the lower section 27 is thin, the electronic device 1 is also thin, which is an advantage for portable electronic devices in particular.

As shown in FIG. 28, an insulating layer 56 is formed on the inside surface of the case 22. The insulating layer 56 is made of, for example, nylon (a trade name of Du Pont).

The insulating layer 56 prevents short circuits between the case 22 made of CFRP containing conductive carbon fibers and the liquid crystal panel 7, the inverter circuit board 93, etc. housed in the case 22.

When the insulating layer 56 made of nylon is heated, it softens and becomes adhesive. By making use of the adhesiveness of the insulating layer 56, the molds 85a–d are stuck and fixed to the insulating layer 56. Because the molds 85a–d are also made of nylon, they stick well to the insulating layer 56.

As shown in FIG. 28, the front and back edges of the case 22 are provided with the molds 85a and 85b, respectively. By making use of the adhesiveness of the insulating layer 56, the molds 85a and 85b are stuck onto the insulating layer 56 to cover the front and back edges of the case 22. Thus, loose ends of carbon fibers, if any, at the front and back edges of the case 22 are covered up.

Because the molds 85a and 85b extend along the front and back edges of the case 22, they serve as beams, too, reinforcing the case 22 against bending and twisting.

As shown in FIG. 28, grooves 54 are made in the surfaces of the molds 85a and 85b which come in contact with the insulating layer 56. When the insulating layer 56 is heated and softened and the molds 85a and 85b are stuck on the insulating layer 56, surplus softened, adhesive nylon enters into the grooves 54.

Thus, the surplus softened, adhesive nylon is prevented from leaking out through the joints between the case 22 and the molds 85a and 85b. If the surplus softened, adhesive nylon leaks out, the appearance of the electronic device 1 is spoiled.

Because the case 22 has the right and left side plates, these side plates play the role of the molds 85a and 85b.

The opposite of the inside surface of the case 22 in FIG. 19 is a facing, which is the surface of one of the outmost layers 53a and 53b. A layer of self-cure resin is formed on the facing.

The layer of self-cure resin is formed by spraying, for example, acrylic or urethane resin with cross-linked structure and high capability of elastic recovery to the facing of the case 22.

If a flaw or dent is made in the self-cure resin layer on the facing of the case 22, it exists as a flaw or dent temporarily and then it disappears gradually because of the high capability of elastic recovery of the self-cure resin layer.

The self-cure resin used in the present embodiment is transparent and colorless. It gives luster to the facing of the case 22 made of dull black CFRP (carbon fiber reinforced plastics) to improve the appearance of the case 22.

Figure 21:
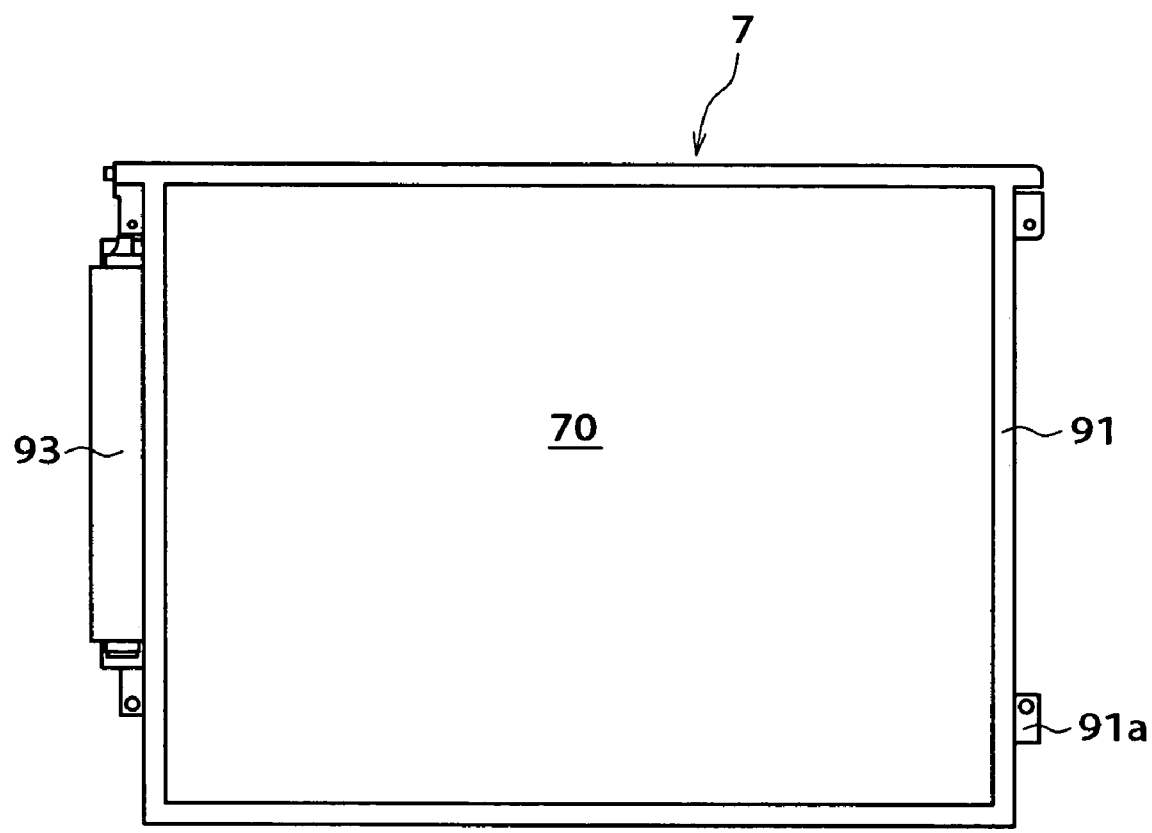
FIG. 21 is a plan view of a liquid crystal panel and an inverter circuit board fitted in the inside of the case 22.

The unit consisting of the liquid crystal panel 7 and the inverter circuit board 93 shown in FIG. 21 is fitted in the inside of the case 22 of FIG. 19. Because the inverter circuit board 93 does not overlap with the liquid crystal panel 7 as shown in FIG. 21, the display 5 is thin. The thinness of the display 5 as well as the thinness of the body 3 contributes to the thinness of the electronic device 1.

The liquid crystal panel 7 has a back-light unit including a light source, light-guiding plates, etc. A fluorescent lamp, for example, is used as the light source, which may be built in the top of the liquid crystal panel 7.

As shown in FIG. 19, a piece of conductor foil 89 such as copper foil is stuck on the inside surface of the case 22 to earth the liquid crystal panel 7 to the case 22.

Figure 27A:
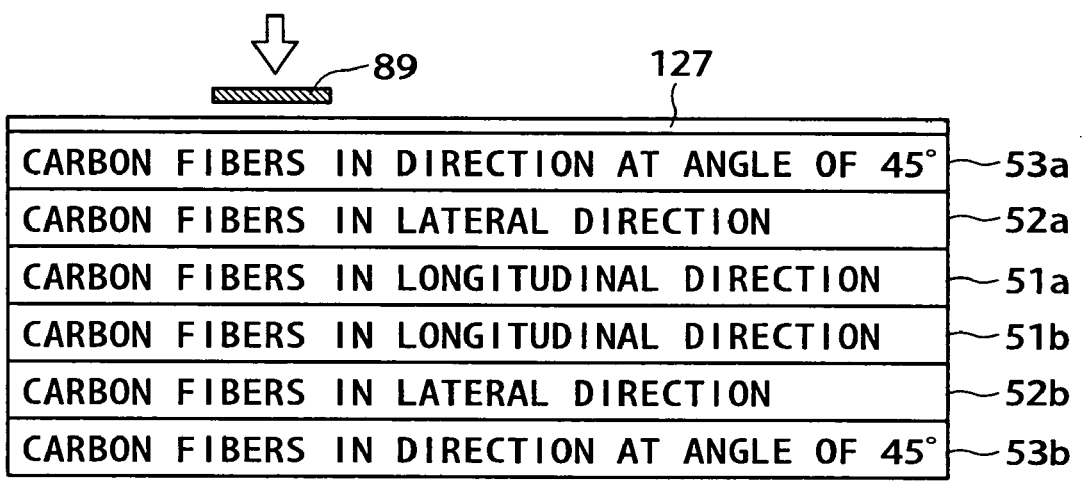
FIGS. 27A and 27B show the pieces of conductor foil being stuck onto the laminated layer of FIGS. 26A and 26B.
Figure 27B:
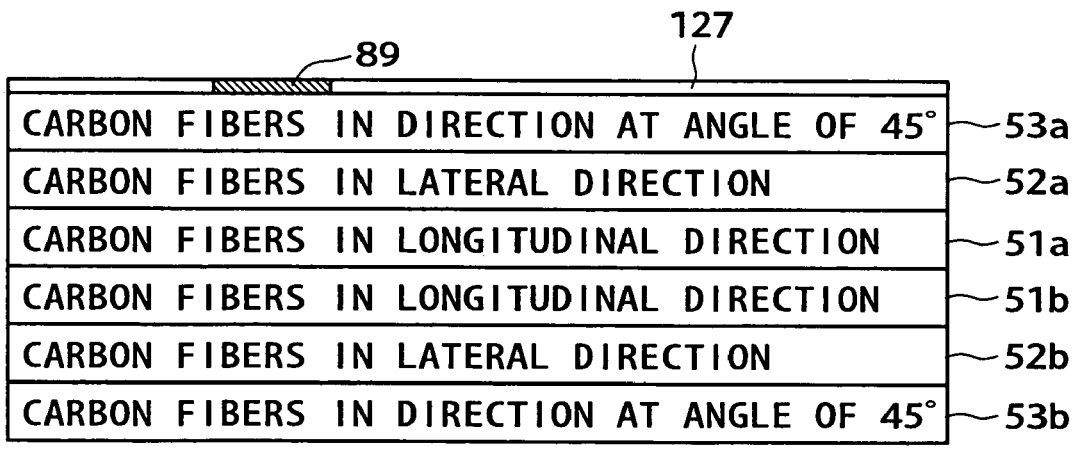

In general, there exists a thin resin film (for example, an epoxy-resin film) on the surface of a base plate made of CFRP; accordingly, the surface of the base plate does not have stable conductivity. As in FIG. 27, if a piece of copper foil 89 is pressed onto a resin film 127 on the surface of the outermost layer 53a, the piece of copper foil 89 pushes aside the resin film 127 and sticks to the layer 53a to secure a stable electric connection between the piece of copper foil 89 and the conductive carbon fibers of the layer 53a.

Figure 22:
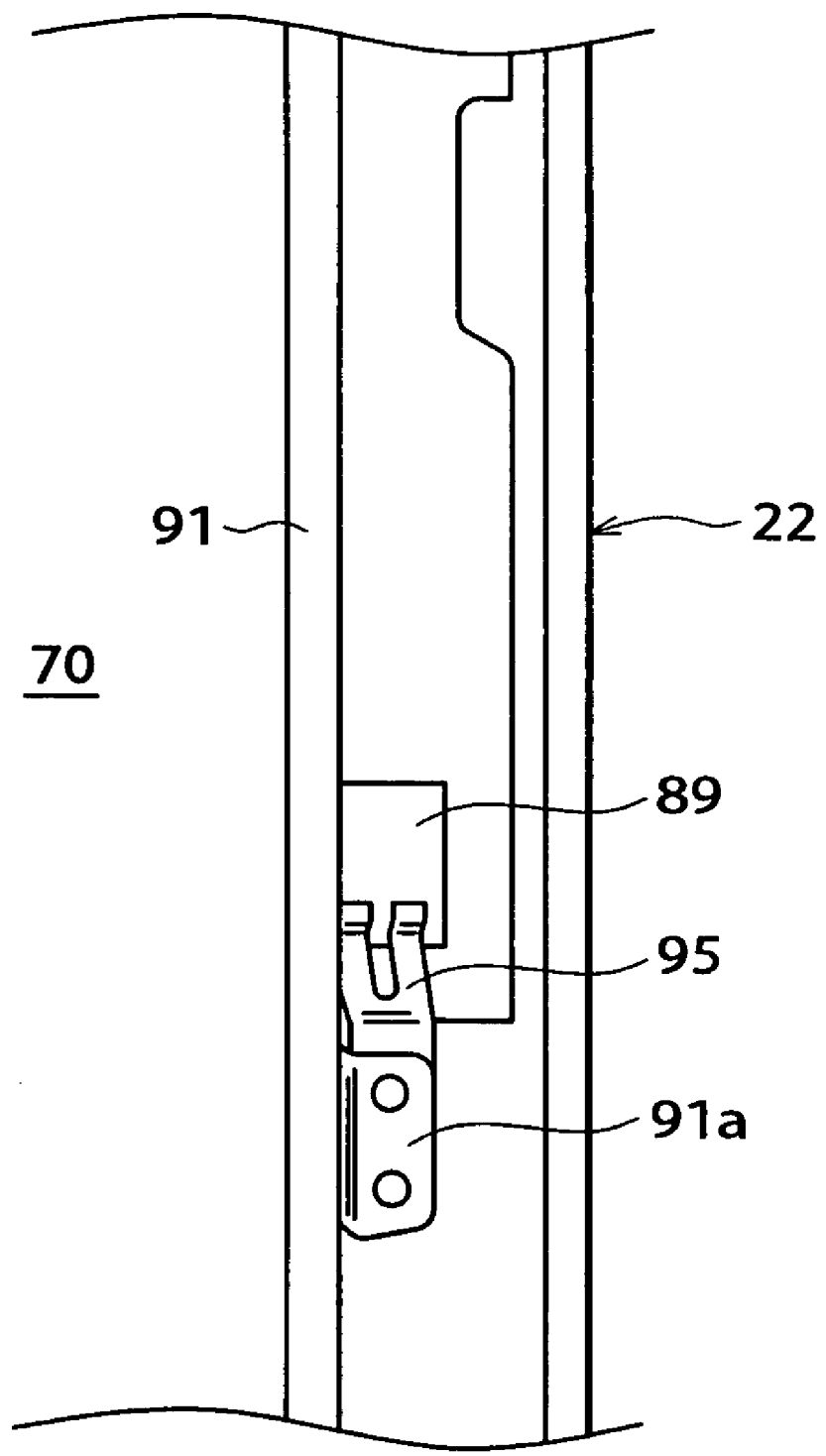
FIG. 22 is an enlarged plan view of a principal part of the liquid crystal panel being housed in the case 22.

As shown in FIG. 22, a leaf spring 95 is fitted between the piece of copper foil 89 on the inside of the case 22 and a metal bracket 91a mounted on a metal frame 91 of the liquid crystal panel 7 to electrically connect the liquid crystal panel 7 to the piece of copper foil 89. The tip of the leaf spring 95 is in elastic contact with the piece of copper foil 89 and the base of the leaf spring 95 is fixed to the metal bracket 91a by, for example, a screw.

Thus, the liquid crystal panel 7 is electrically stably connected to the case 22 with a large area to protect the liquid crystal panel 7 from external magnetic noises and prevent the magnetic noises generated by the liquid crystal panel 7 from affecting external components and devices.

As shown in FIG. 1, a frame 24 is fitted to the case 22 housing the liquid crystal panel 7 to expose the screen 70 of the liquid crystal panel 7.

The hinges "h" to connect the body 3 and the display 5 will next be described below.

When the lower section 27 of FIG. 3 and the upper section 28 of FIG. 17 are combined, the part 42a of the lower section 27 and the part 74a of the upper section 28 are combined to become a cylinder of a hinge "h." One hinge h (the left hinge h in FIGS. 1 and 2) is constructed when the cylinder of the case 26 is rotatably connected with the constituent part 87a of the case 22 shown in FIG. 19.

On the other hand, when the lower section 27 of FIG. 3 and the upper section 28 of FIG. 17 are combined, the part 42b of the lower section 27 and the part 74b of the upper section 28 are combined to become another cylinder. The other hinge h (the right hinge h in FIGS. 1 and 2) is constructed when the cylinder of the case 26 is rotatably connected with the constituent part 87b of the case 22 shown in FIG. 19.

Figure 23:
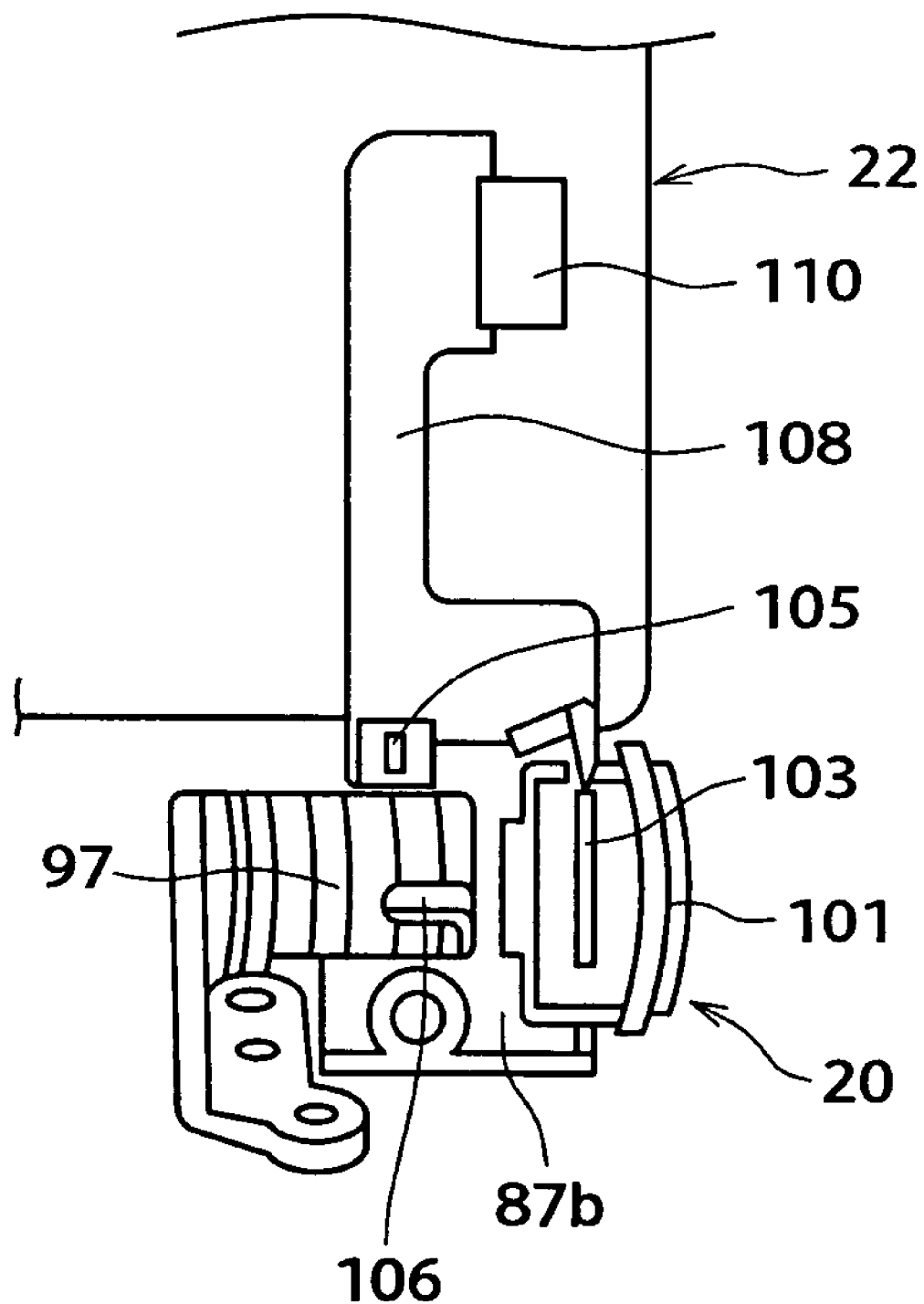
FIG. 23 is an enlarged view of one of the two constituent parts of hinges formed at the back of the case 22.

As shown in FIG. 23, a hinge fitting 97 is provided on the other hinge h. One end of the hinge fitting 97 is fixed to the cylinder of the case 26 by, for example, a screw. The constituent part of the case 22 receives a cylindrical portion of the hinge fitting 97, and the case 22, or the display 5, is relatively rotatable about the cylindrical portions of the hinge fittings 97.

Further, as shown in FIG. 23, a power switch 20 is provided on an edge of the hinge's shaft (a side portion which does not face the other hinge with respect to the longitudinal direction of the axis of the hinge, namely, a side portion on the right in FIG. 23). (Also, see FIG. 2)

Figure 25:
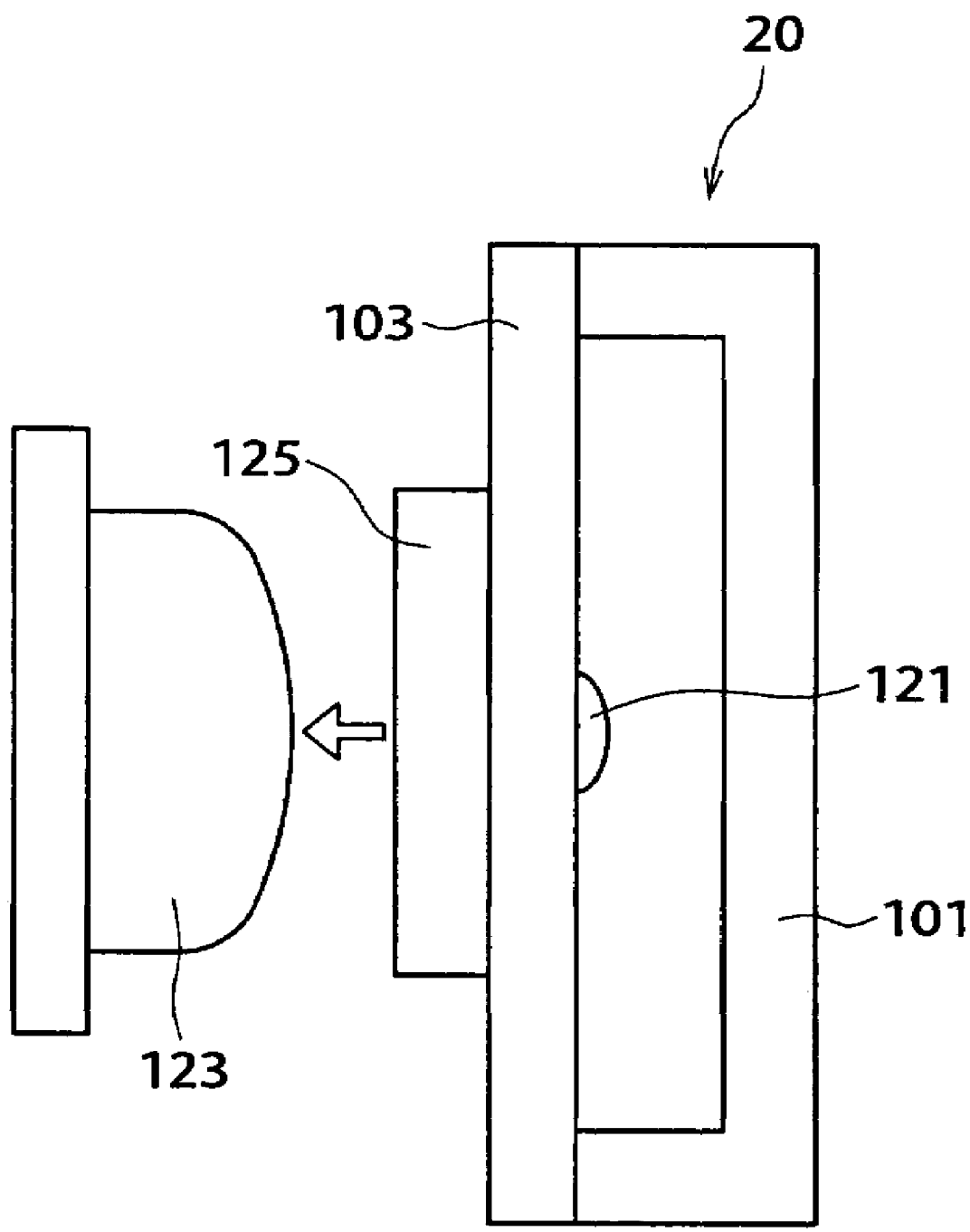
FIG. 25 is a schematic diagram showing a construction of a power switch installed in the constituent part of the hinge shown in FIG. 23.

The power switch 20 comprises, as shown in a schematic diagram of FIG. 25, a pressing operation part 101, a light-emitting element 121, a switch 125, and a contact 123.

The pressing operation part 101 can be pressed along the longitudinal direction of the axis of the hinge (the direction shown by the arrow in FIG. 25). The light-emitting element 121 is placed inside the pressing operation part 101. The light-emitting element 121 is, for example, a light-emitting diode and is mounted on a surface, which faces the pressing operation part 101, of the circuit board 103 joined with the pressing operation part 101.

The switch 125 is mounted on the other side of the circuit board 103. The contact 123 provided facing the switch 125 is fixed to the constituent part of the case 22.

As shown in FIG. 2, the pressing operation part 101 is exposed to the outside. When the pressing operation part 101 is pressed in the direction of the arrow in FIG. 25 by a user's finger and so on, it moves toward the contact 123 together with the circuit board 103, and the light-emitting element 121 and the switch 125 mounted thereon.

When the switch 125 is pressed touching the contact 123, the power is turned off when the power of the electronic device 1 is on and the power is turned on when the power of the electronic device 1 is off.

When the pressing operation part 101 is pressed sideways by the user's finger, the direction of the movement tends to be inclined compared to when it is pressed downward. To cope with such a problem, the surface of the switch 125 which meets the contact 123 is curved. Therefore, in spite of a little inclination, the contact 123 and the switch 125 can meet stably (for example, compared to when the surface is flat, the contact area can be larger) and the power can be turned on or off reliably.

Further, if all or a part (for example, a ring portion of the outer edge) of the portion of the pressing operation part 101 exposed to the outside is formed as a light-transmission part made of transparent resin material, the light from the light-emitting element 121 can be guided to the outside through such a light-transmission part. Accordingly, when the power is on, for example, a red light can be turned on to have a user confirm its state visually. Alternatively, when in a power-saving standby state, a green light can be turned on and off to have the user confirm its state visually.

The light transmission part of the pressing operation part 101 is always exposed to the outside regardless of the electronic device 1 being opened or closed. Therefore, even if the display 5 is closed while the power is on, the state can be checked by the light visible through the light transmission part.

Also, when carrying the electronic device 1 in a bag or so with the display 5 closed, the pressing operation part 101 may be pressed by an article in the bag. Accordingly, in the present embodiment, as in FIG. 23, a closed-state detecting switch 105 is provided on the constituent part of the case 22, and a closed-state detecting contact 106 is provided on the hinge fitting 97 as a single piece.

When the display 5 is closed onto the body 3 by the relative rotation of the constituent part of the case 22 and the hinge fitting 97, the closed-state detecting switch 105 and the closed-state detecting contact 106 meet, turning on the closed-state detecting switch 105. The closed-state detecting switch 105 is kept turned on while the display 5 is closed onto the body 3.

Accordingly, when the closed-state detecting switch 105 is on, the electronic device 1 can be prevented from being turned on even if the pressing operation part 10 is pressed. Alternatively, when it is closed while the power is on and the closed-state detecting switch 105 is turned on, it becomes possible to automatically turn the power off or to send the electronic device 1 into a power-saving standby state.

Figure 24:
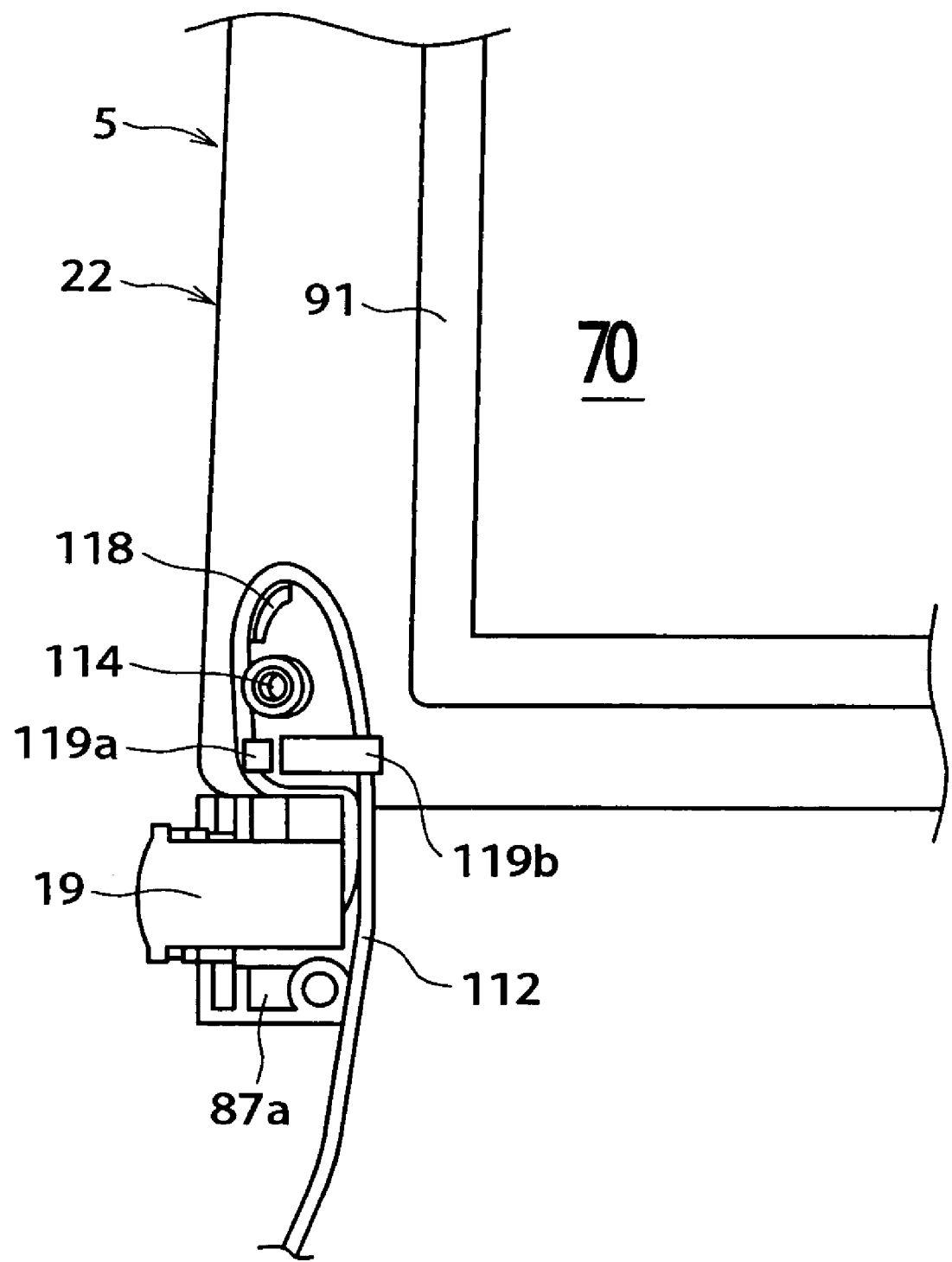
FIG. 24 is an enlarged view of the other constituent part of the hinges formed at the back of the case 22.

Further, as in FIG. 24, a connector 19 for an AC adapter is provided on the edge (side portion on the left in FIG. 24) of the shaft of the hinge opposite the hinge in which the power switch 20 is provided (Also, see FIG. 1). A socket for the connector 19 is always exposed to the outside regardless of the opened and closed state of the electronic device 1.

As in FIG. 24, a cable 112 for connecting the connector 19 with the motherboard 30 of the body 3 is not directed straight from the connection with the connector 19 to the side of the body 3 (lower position in FIG. 24). On the contrary, the cable 112 detours around the area near the connection with the connector 19 so that it forms a loop on the side of the display 5 and is drawn to the side of the body 3.

The detouring portion of the cable 112 forms a loop being guided by a boss 114 erected inside the case 22 and guide members 118, 119a, 119b.

Accordingly, even if opening and closing of the display 5 away from and onto the body 3 are repeated, the connection (soldered, for example) to the connector 19 of the cable 112 is prevented from receiving a concentrated excessive load such as twisting and pulling, thereby a break in the cable being prevented.

Further, the guide members 119a and 119b restrict the rising of the detouring portion of the cable 112 from the inside surface of the case 22 so that the looped detouring portion can be held stably.

Further, the previously described power switch 20 shown in FIG. 23 is configured such that a cable (not shown) connected to the connector 110 via the flexible wiring board 108 formed on the inside surface of the case 22 is drawn to the side of the body 3. Therefore, again, the cable is not drawn directly from the power switch 20 to the body 3. This is because the previously described inverter circuit board 93 is not provided on the inside surface of the case 22 on this side and there is enough space for arranging the above flexible wiring board 108 and the connector 110.

As described above, the power switch 20 and the connector 19 are provided on the edge portion of the shaft of the hinge, which has not been used at all, namely, a dead space. Therefore, components of the body 3 and the display 5 can be positioned more freely. By suitably arranging those components, the body 3 and the display 5 can be made thinner as described above. Further, since the power switch 20 is positioned away from the keyboard 11 and other operation buttons 15a–15c (see FIG. 1), it is prevented from being mistakenly pressed, ensuring reliable operation. Thus, mistakes such as turning the power off while the device is in use can be avoided.

Functions such as left-clicking, right-clicking, and scrolling are assigned to the three operation buttons 15a–c disposed on the front edge about the center between the right and left sides of the body 3.

Also, as shown in FIGS. 1 and 2, there is a battery 9 provided between the hinges h.

Further, as shown in FIGS. 1 and 2, a bottom surface of the lower section 27 is not flat, and the rear end on the side of the hinges h is curved (so that it rises a little from the surface where the electronic device is placed). Compared to the bottom surface of the lower section 27 being flat, this structure reinforces the lower section 27 against bending and twisting.

Figure 29:
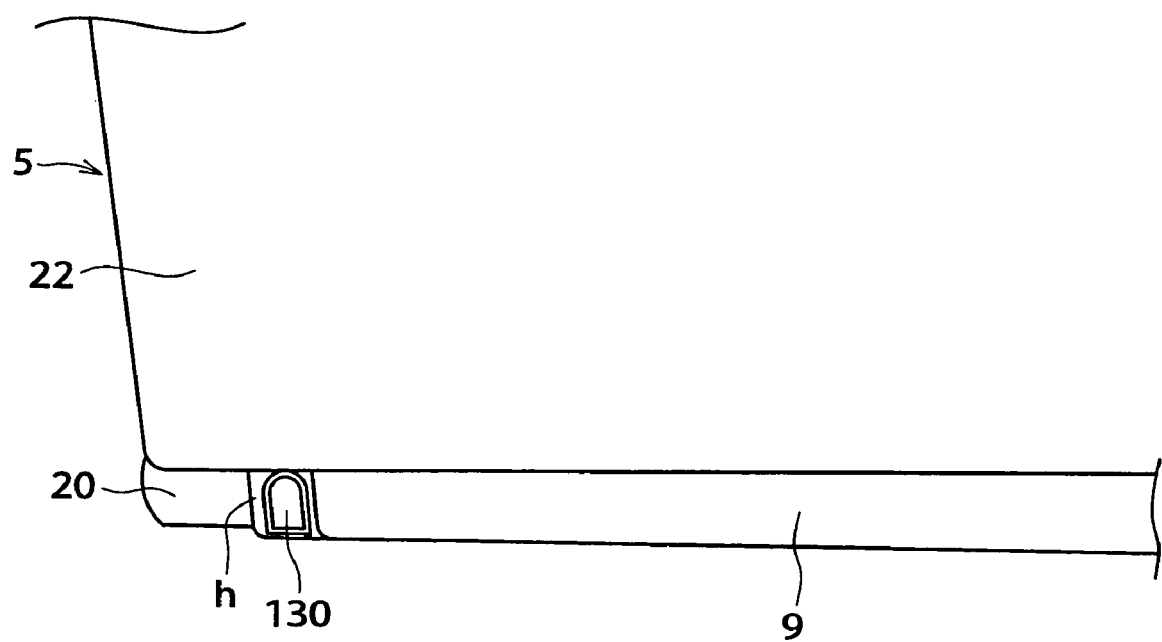
FIG. 29 is an enlarged view of the rear portion of the electronic device in an opened state according to the present embodiment.

Also, as shown in FIG. 29, a stopper 130 is provided on a periphery of each hinge h facing backward of the electronic device 1. When the display 5 is opened, the display 5 is prevented from opening further by the lower edge of the display 5 meeting the stopper 130. For example, in the present embodiment, the angle of opening (an angle formed by the body 3 and the display 5) is restricted to 135°.

Figure 30:
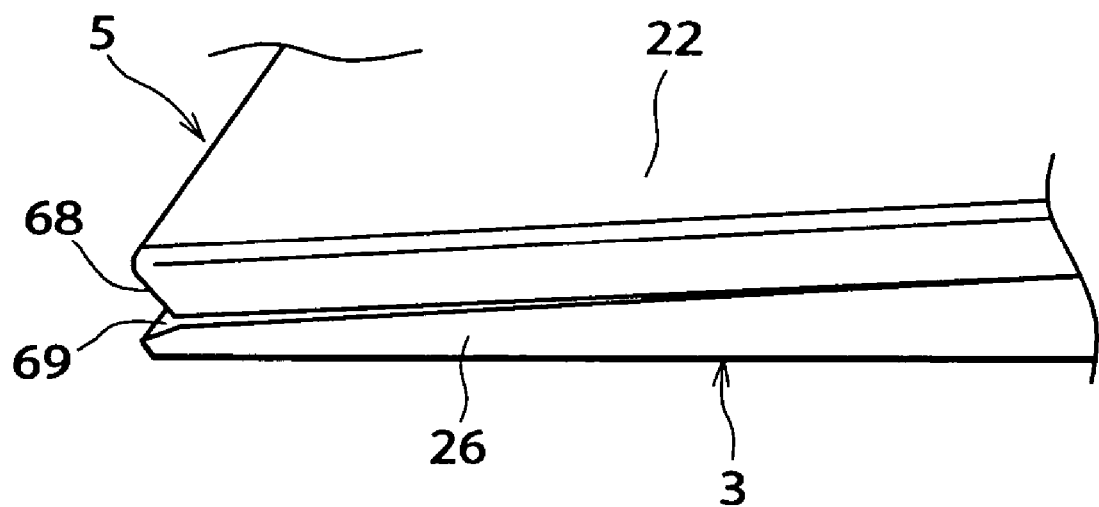
FIG. 30 is an enlarged view of the front edge portion of the electronic device in a closed state according to the present embodiment.

Further, as shown in FIGS. 2 and 30, tapered portions 68 and 69 are formed respectively at the front edges of the case 26 and the case 22 facing with each other so that the front edges make a V-shape when the display 5 is closed onto the body 3.

The tapered portion 68 is inclined upward toward the front, and the tapered portion 69 is inclined downward toward the front. The distance between the tapered portions 68 and 69 in a closed state, namely, when the case 26 and the case 22 are closed, gradually increases toward the front.

With such a structure, even if the body 3 and the display 5 are very thin like the ones in the present embodiment, the front edge of the display 5 can easily be lifted from the body 3 staying where it is by putting a finger in a V-shaped area between the tapered portions 68, 69 and hooking the tapered portion 68 of the case 22 with a fingertip.

Further, as shown in FIGS. 1 and 2, various indicator lamps 17a–17c provided in the front edge of the body 3 extend to the downwardly inclined area of the front edge. Therefore, even when the display 5 is closed as in FIG. 2, the above various indicator lamps 17a–17c are visible to the user.

Although the invention has been described in its preferred form, it is to be understood that the invention is not limited to the specific embodiments thereof and various changes and modifications may be made without departing from the sprit and the scope of the invention.

In stead of the PC card slot of the body 3, any other semiconductor-memory card slot may be provided.

Further, the heat-transmitting sheets 72 and 47 may be stuck to the inside of the upper section 28 and an entire surface of the inside of the lower section 27, respectively.

What is claimed is:

1. An electronic device whose heat-generating components are disposed in a case, comprising:
    heat-transmitting sheets, which are stuck to the inside of said case and in contact with said heat-generating components; and
    elastic sheets which are laid between the portions, contacting said heat-generating components, of said heat-transmitting sheets and the inside of said case,
    wherein an inside surface of a lower section has a memory device-mounting space and ribs are formed in said space to support said memory device above said inside surface.

2. The electronic device according to claim 1, wherein said heat-transmitting sheets are graphite sheets.

3. The electronic device according to claim 1, wherein insulating sheets are overlaid on said heat-transmitting sheets.

4. The electronic device according to claim 1,
    wherein said electronic device comprises a body having an input unit and a display which can freely be opened away from and closed onto said body, wherein said heat-generating components are disposed near the back side of said body, and wherein said input is disposed near the front side of said body.

5. The electronic device according to claim 4, wherein said heat-generating components are disposed near said back side of said body and about the center between the right and left sides of said case.

6. The electronic device according to claim 1, wherein an insulating sheet is laid between said heat-transmitting sheet and said case.

7. An electronic device whose heat-generating components are disposed in a case, comprising:
    heat-transmitting sheets, which are stuck to the inside of said case and in contact with said heat-generating components; and
    elastic sheets which are laid between the portions, contacting said heat-generating components, of said heat-transmitting sheets and the inside of said case,
    wherein said case comprises a lower section and an upper section,
    wherein a motherboard on both sides of which said heat-generating components are mounted is provided between said lower section and said upper section,
    wherein said heat-generating component mounted on a surface facing said lower section is in contact with said heat-transmitting sheet stuck on the inside surface of said lower section with said elastic sheet laid in between, and
    wherein said heat-generating component mounted on a surface facing said upper section is in contact with said heat-transmitting sheet stuck on the inside surface of said upper section with said elastic sheet laid in between.

8. The electronic device according to claim 7, wherein said heat-transmitting sheets are graphite sheets.

9. The electronic device according to claim 7, wherein insulating sheets are overlaid on said heat-transmitting sheets.

10. The electronic device according to claim 7,
    wherein said electronic device comprises a body having an input unit and a display which can freely be opened away from and closed onto said body, wherein said heat-generating components are disposed near the back side of said body, and wherein said input unit is disposed near the front side of said body.

11. The electronic device according to claim 1, wherein said heat-generating components are disposed near said back side of said body and about the center between the right and left sides of said case.

12. The electronic device according to claim 7, wherein an insulating sheet is laid between said heat-transmitting sheet and said case.

13. The electronic device according to claim 7, wherein said heat-generating components mounted on both the sides of said motherboard respectively are so positioned that they do not overlap with each other.

14. The electronic device according to claim 7, wherein the most heat-generating component of said heat-generating components mounted on both the sides of said motherboard is in contact with said heat-transmitting sheet stuck on said lower section.

* * * * *

UNITED STATES PATENT AND TRADEMARK OFFICE
CERTIFICATE OF CORRECTION

PATENT NO. : 7,242,585 B2 Page 1 of 1
APPLICATION NO. : 10/970289
DATED : July 10, 2007
INVENTOR(S) : Yohei Fukuma et al.

It is certified that error appears in the above-identified patent and that said Letters Patent is hereby corrected as shown below:

Column 16, line 41, change "claim 1" to --claim 10--.

Signed and Sealed this

Twenty-seventh Day of November, 2007

JON W. DUDAS
*Director of the United States Patent and Trademark Office*